(12) United States Patent
Ogiwara et al.

(10) Patent No.: US 7,233,536 B2
(45) Date of Patent: Jun. 19, 2007

(54) SEMICONDUCTOR MEMORY DEVICE HAVING MEMORY CELLS TO STORE CELL DATA AND REFERENCE DATA

(75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/239,219

(22) Filed: Sep. 30, 2005

(65) Prior Publication Data

US 2006/0067138 A1    Mar. 30, 2006

(30) Foreign Application Priority Data

Sep. 30, 2004   (JP) .............................. 2004-289244

(51) Int. Cl.
*G11C 7/00*  (2006.01)
(52) U.S. Cl. ...................................... 365/205; 365/210
(58) Field of Classification Search ................ 365/205, 365/210, 207, 208
See application file for complete search history.

(56) References Cited

U.S. PATENT DOCUMENTS 5,276,650 A  * 1/1994 Kubota ....................... 365/207

6,449,182 B1 * 9/2002 Ooishi ......................... 365/63
2003/0095457 A1 * 5/2003 Jeon et al. .................. 365/205

OTHER PUBLICATIONS

Toshiyuki Nishihara, et al. "A Quasi-Matrix Ferroelectric Memory for Future Silicon Storage", IEEE Journal of Solid-State Circuits, vol. 37, No. 11, Nov. 2002, pp. 1479-1484.
Junichi Yamada, et al. "A Self-Reference Read Scheme for a 1T/1C FeRAM", 1998 Symposium on VLSI Circuits Digest of Technical Papers, pp. 238-241.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes a memory cell array, a sense amplifier, and a voltage generator. The memory cell array has a plurality of memory cells. Each of the memory cells is written with "0" or "1" as reference data after "0" or "1" as cell data has been read out from the memory cell. The sense amplifier compares and amplifies the reference data and the cell data read from a memory cell. The voltage generator keeps constant rate of change with time of at least one potential supplied for a read operation for the time interval from readout of the cell data is started until completion of readout of the reference data.

17 Claims, 30 Drawing Sheets

S/A

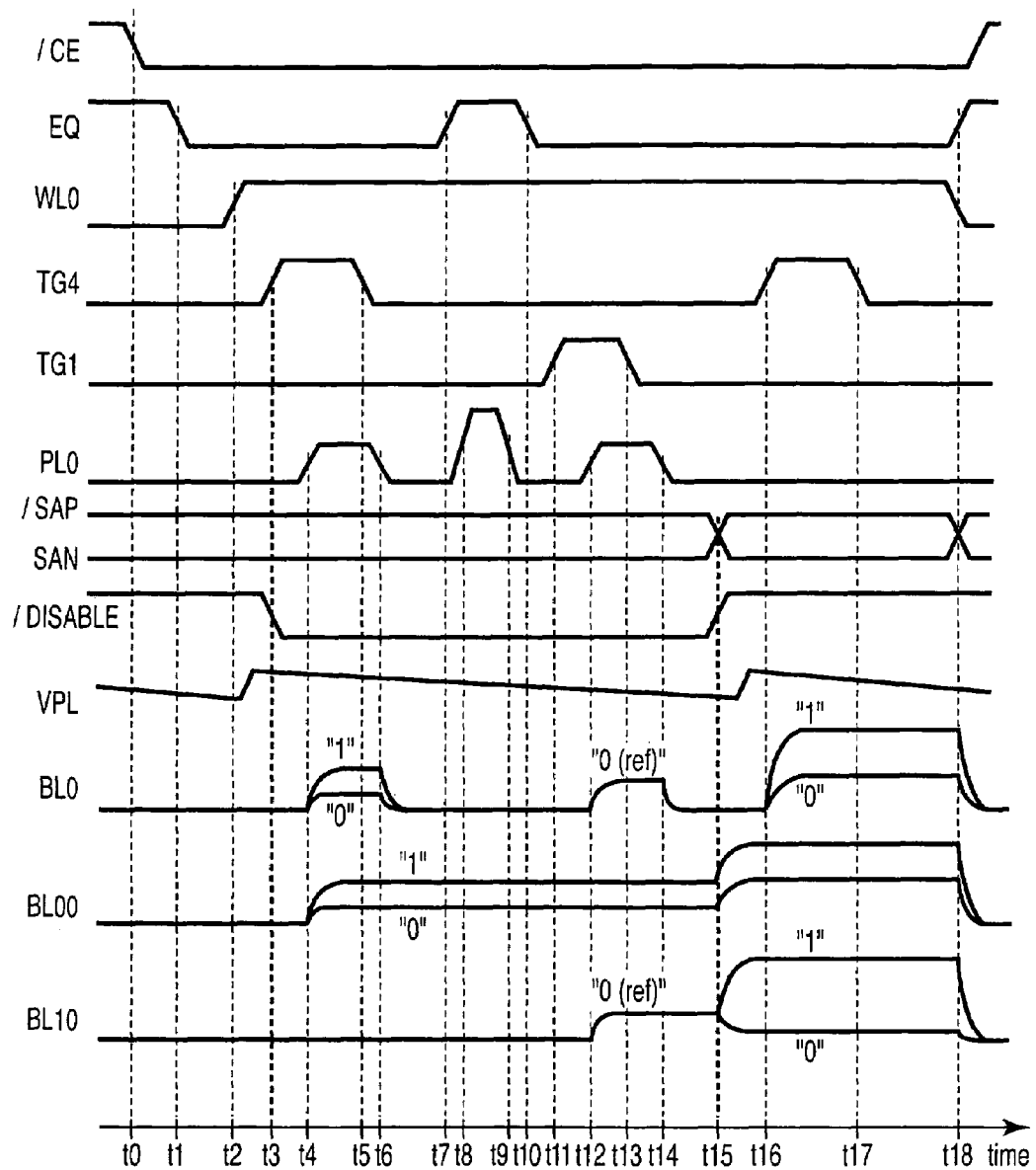
F I G. 4

Selected memory cell

Unselected memory cell

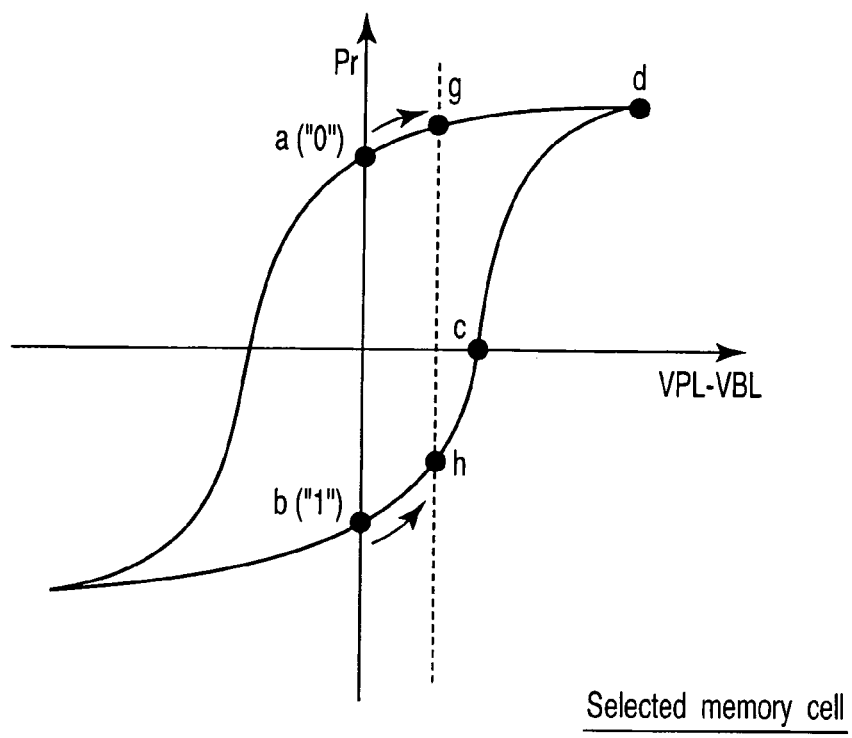
FIG. 7 Selected memory cell
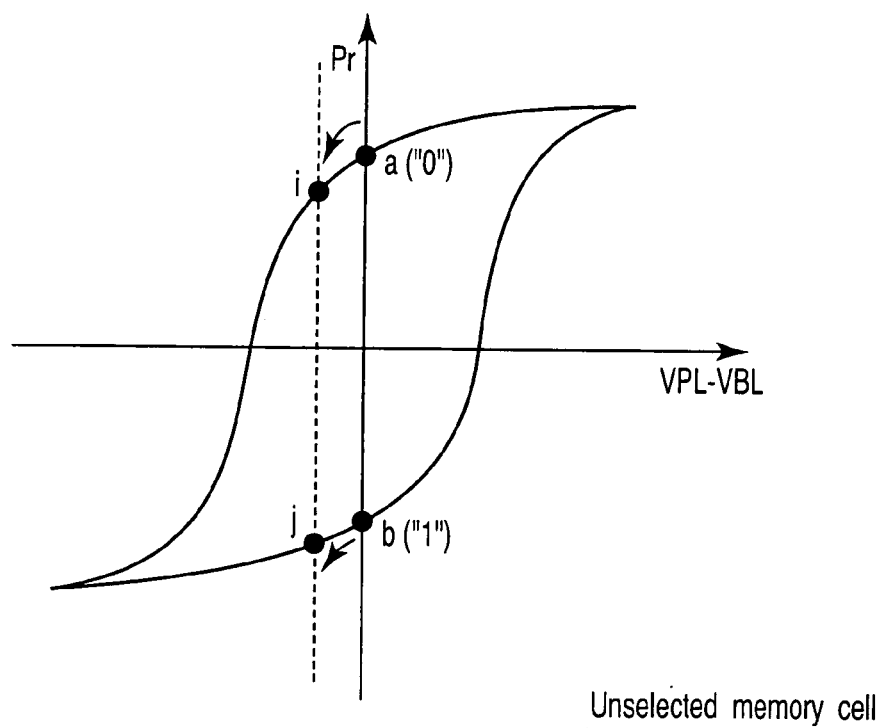
FIG. 8 Unselected memory cell

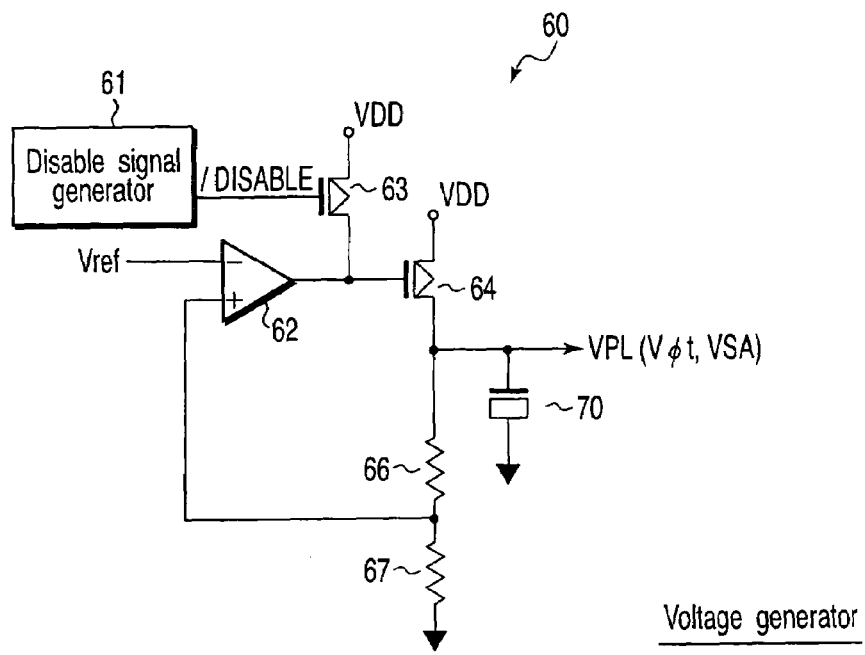
F I G. 12
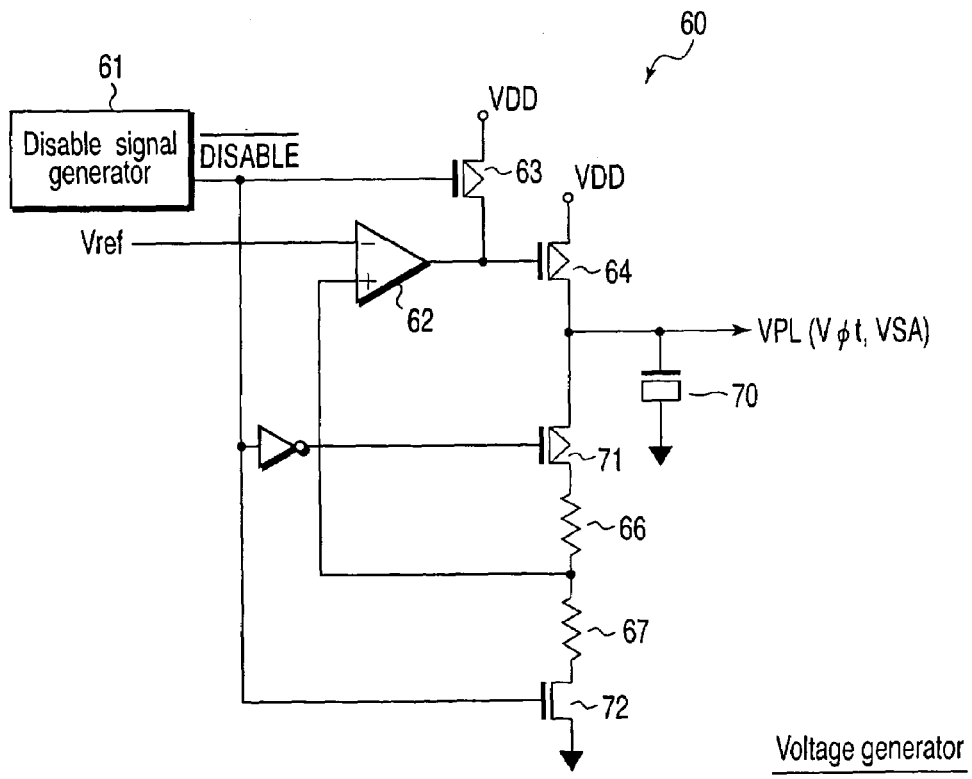
F I G. 13

Memory cell array

Memory cell array

Memory cell array

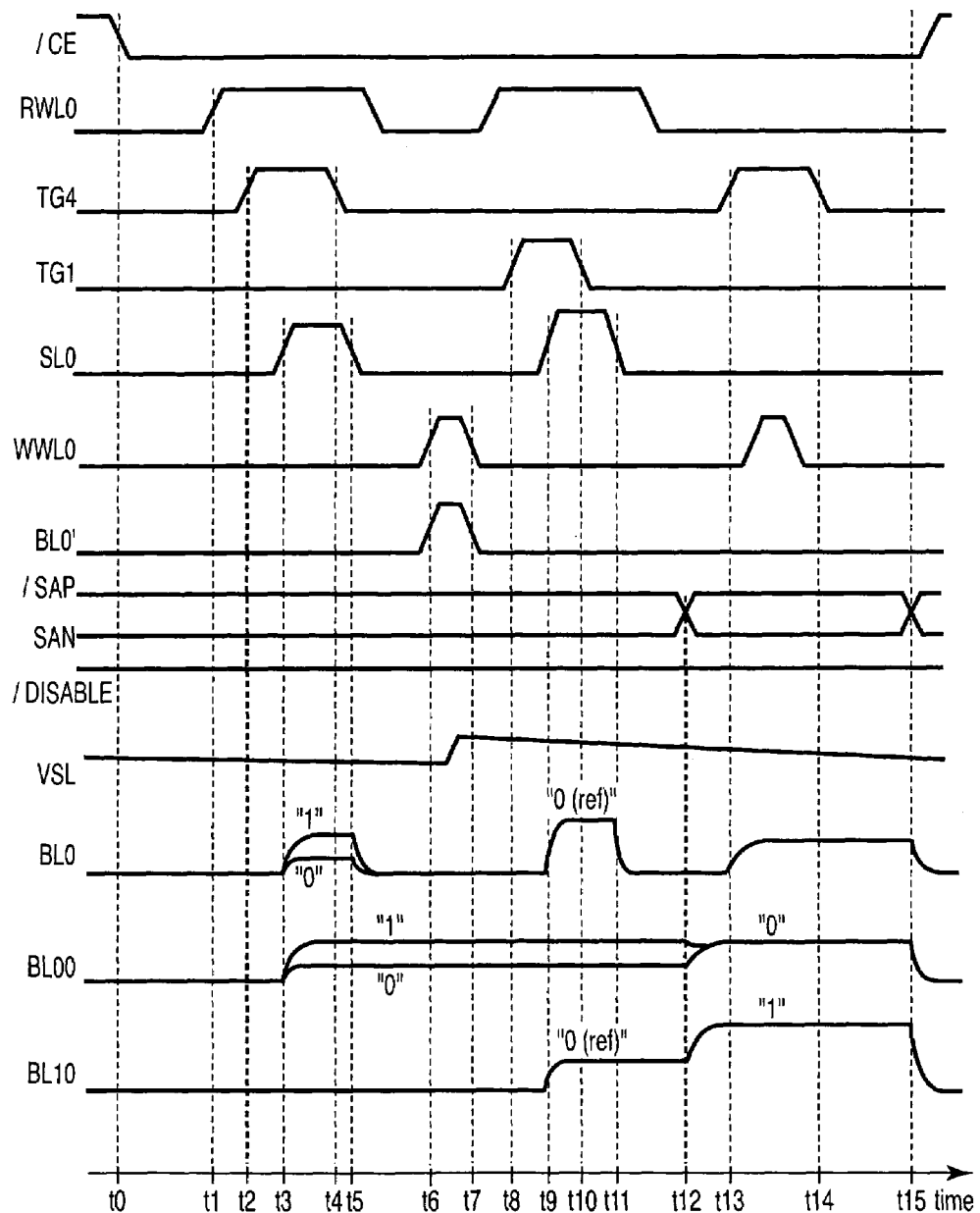
F I G. 28

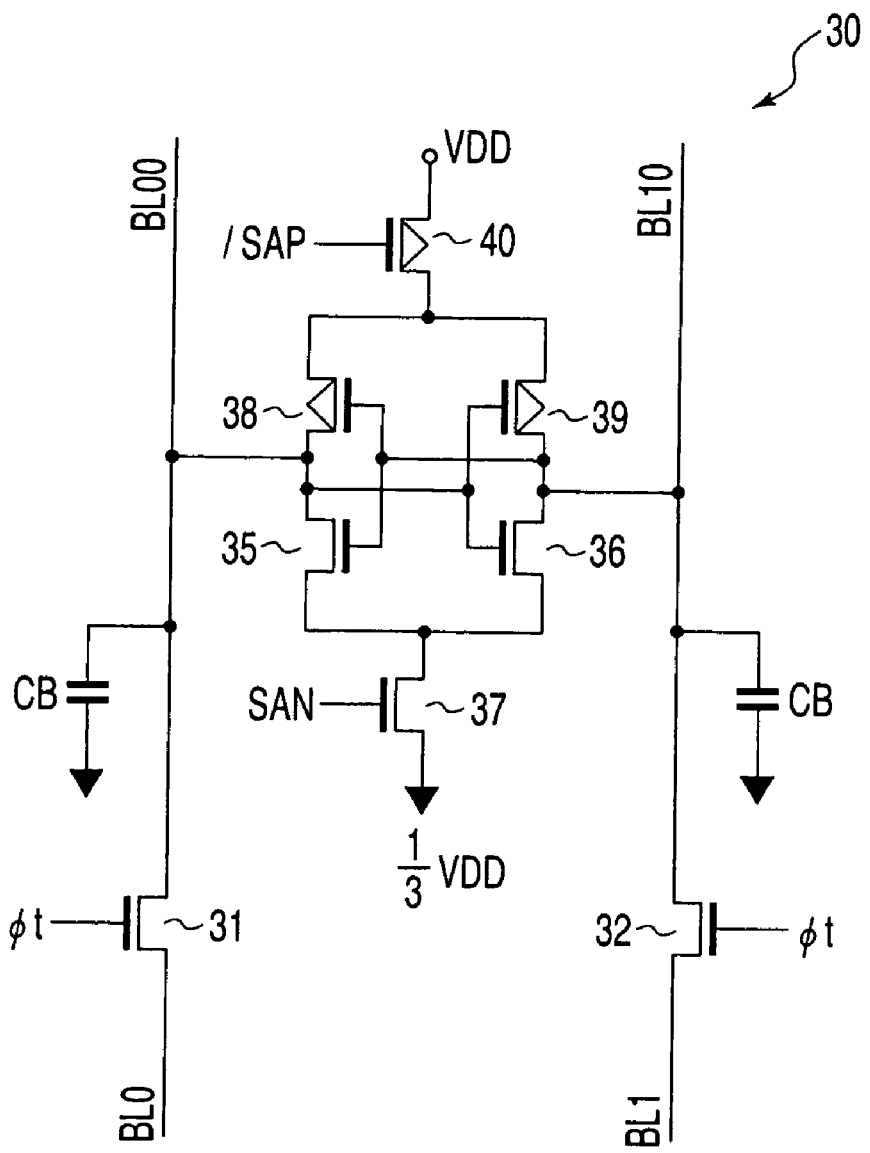
F I G. 29

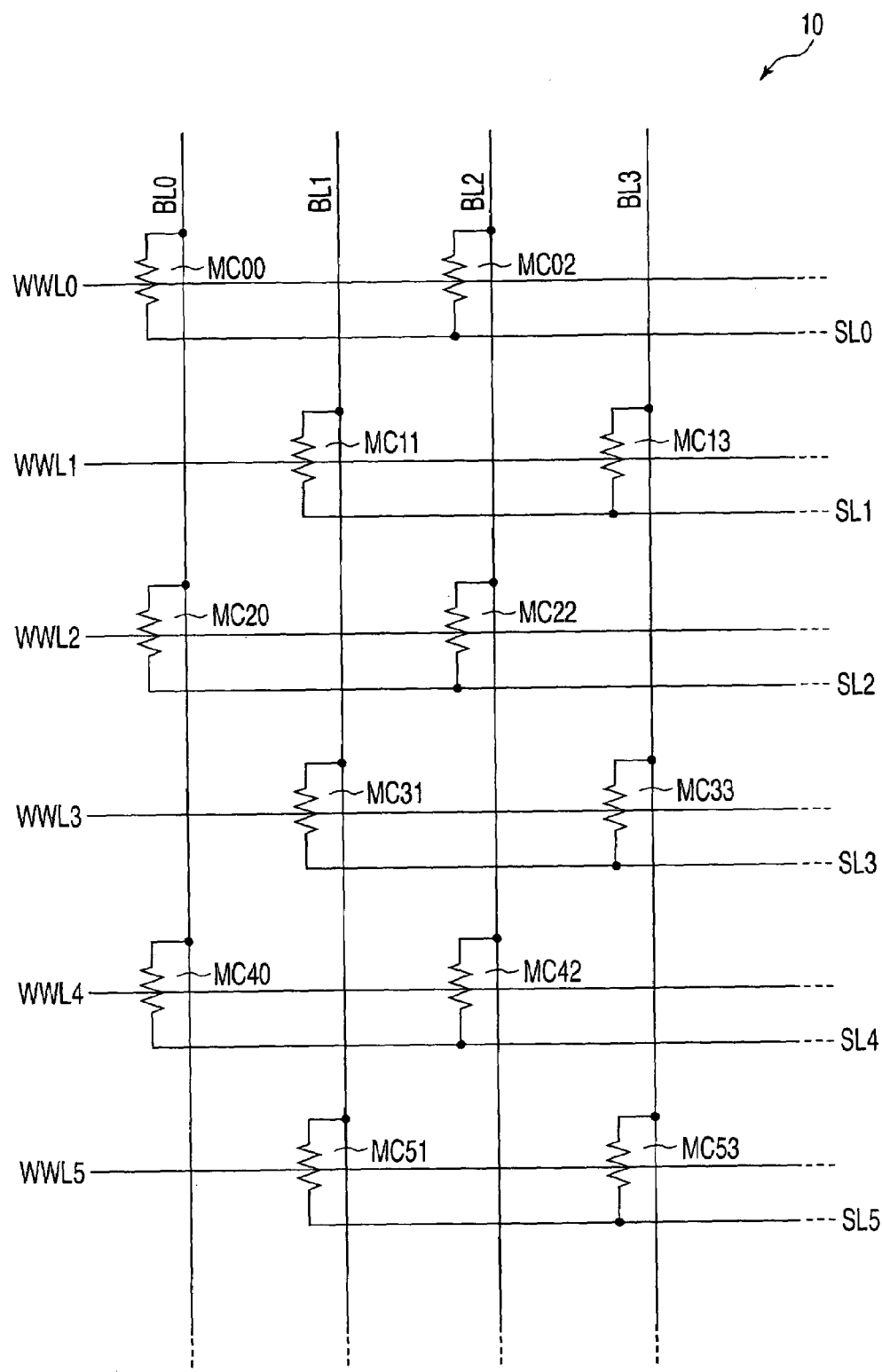
F I G. 31

US 7,233,536 B2

SEMICONDUCTOR MEMORY DEVICE HAVING MEMORY CELLS TO STORE CELL DATA AND REFERENCE DATA

CROSS-REFERENCE TO RELATED APPLICATIONS

This application is based upon and claims the benefit of priority from prior Japanese Patent Application No. 2004-289244, filed Sep. 30, 2004, the entire contents of which are incorporated herein by reference.

BACKGROUND OF THE INVENTION

1. Field of the Invention

The present invention relates to a semiconductor memory device and more specifically to a semiconductor memory device which uses ferroelectric capacitors or MTJ (Magnetic Tunnel Junction) devices.

2. Description of the Related Art

In recent years, a ferroelectric memory has received attention which has ferroelectric capacitors the dielectric layer of which is made of a ferroelectric material.

The ferroelectric memory utilizes the hysteresis property which is one of the properties of ferroelectric materials and stores data ("0" or "1") through two different remanent polarization in a nonvolatile manner in a ferroelectric capacitor. To read the data, it is required to drive a plate line.

There has been a proposal for a memory cell array configuration of the ferroelectric memory in which two or more ferroelectric capacitors are connected to one cell transistor to allow a cross point type of memory cell array (see, for example, "A Quasi-Matrix Ferroelectric Memory for Future Silicon Storage" by Toshiyuki Nishihara et al, IEEE Journal of Solid State Circuits, Vol. 37, No. 11, Nov. 2002). This configuration can provide high integration density. In reading "1" in particular, however, electric fields will be produced between a bit line and nonselected plate line to disturb nonselected memory cells. As a result, data stored in the nonselected memory cells will suffer a deterioration in reliability.

In general, a combination of one cell transistor and one ferroelectric memory is known as a memory cell configuration of the ferroelectric memory. A method has been proposed by which such DRAM-type memory cells are arranged using folded bit lines to form a memory cell array and a selected memory cell itself is used as a reference potential generating cell (see, for example, "A Self-Reference Read Scheme for a 1T/1C FeRAM" by Junichi Yamada et al, 1998 Symposium on VLSI Circuits Digest of Technical Papers pp. 238–241. However, this memory cell array configuration is inferior in integration density to the previously described cross point type of memory cell array configuration.

BRIEF SUMMARY OF THE INVENTION

A semiconductor memory device according to an aspect of the invention comprises a memory cell array having a plurality of memory cells which are arranged in columns and rows, each of the memory cells being written with "0" or "1" as reference data after "0" or "1" as cell data has been read from the memory cell; a sense amplifier which compares and amplifies the reference data and the cell data read from the memory cell; and a voltage generator which keeps constant rate of change with time of at least one potential supplied for a read operation for the time interval from readout of the cell data is started until the reference data has been read out.

BRIEF DESCRIPTION OF THE SEVERAL VIEWS OF THE DRAWING

FIG. 4 is a timing chart for various signals when the ferroelectric memory according to the first embodiment is in a read operation;

FIG. 7 is a graph indicating the hysteresis loop of the ferroelectric capacitor in the selected memory cell in the ferroelectric memory of the first embodiment and illustrates the situation when a voltage lower than the coercive voltage is applied to the selected plate line;

FIG. 8 is a graph indicating the hysteresis loop of the ferroelectric capacitor in the nonselected memory cell in the ferroelectric memory of the first embodiment and illustrates the situation when a voltage lower than the coercive voltage is applied to the selected plate line;

FIG. 12 is a circuit diagram of a plate line voltage generator of a ferroelectric memory according to a second embodiment of the present invention;

FIG. 13 is a circuit diagram of the plate line voltage generator of a ferroelectric memory according to a modification of the second embodiment of the present invention;

FIG. 28 is a timing chart for various signals when a conventional ferroelectric memory is in a read operation;

FIG. 29 is a circuit diagram of a sense amplifier of a ferroelectric memory according to a thirteenth embodiment of the present invention;

FIG. 31 is a circuit diagram of a sense amplifier in an MRAM according to a modification of the eleventh embodiment of the present invention;

DETAILED DESCRIPTION OF THE INVENTION

Figure 1:
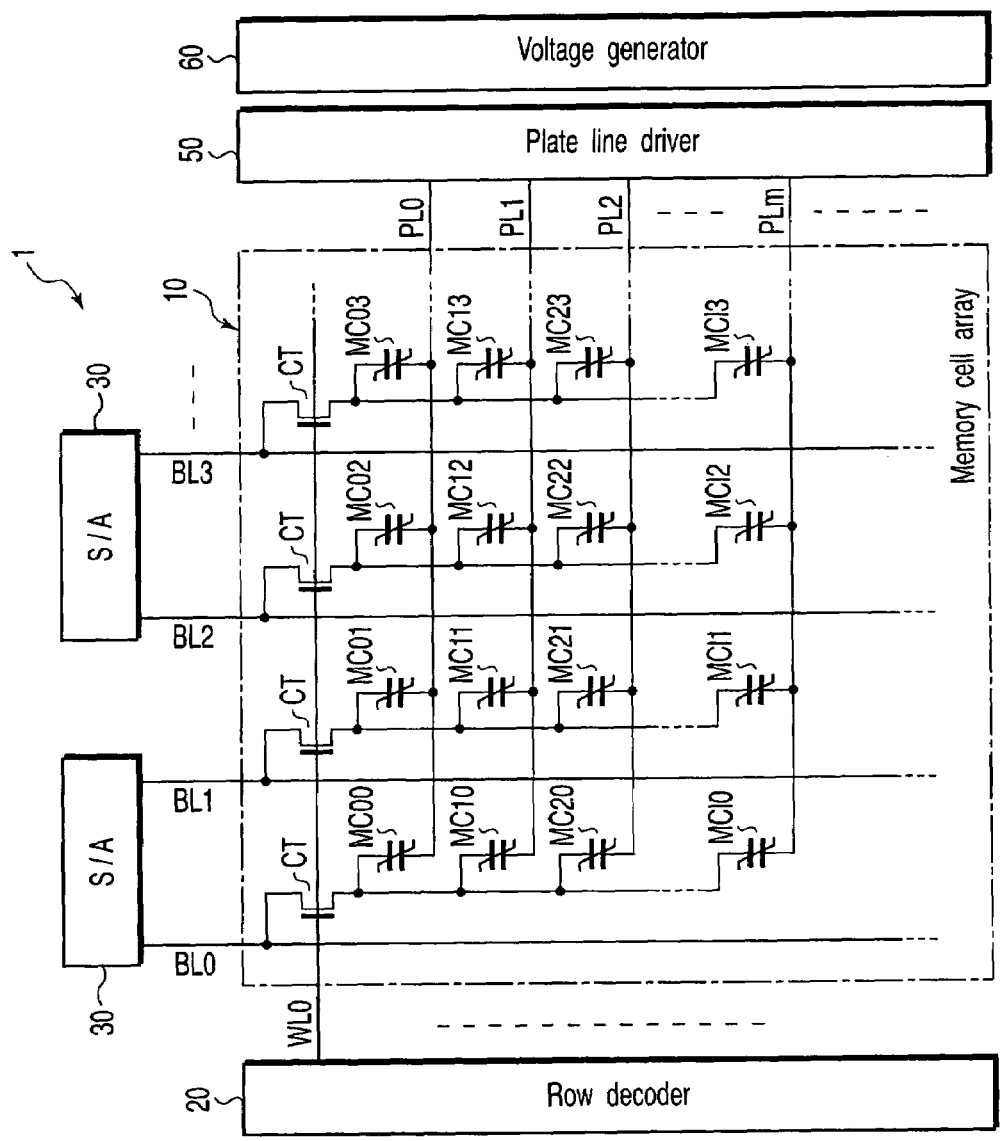
FIG. 1 is a block diagram of a ferroelectric memory according to a first embodiment of the present invention.

Reference is now made to FIG. 1 to describe a semiconductor memory device according to a first embodiment of the present invention. FIG. 1 is a block diagram of a ferroelectric memory of this embodiment.

As shown in FIG. 1, the ferroelectric memory 1 comprises a memory cell array 10, a row decoder 20, sense amplifiers 30, a plate line driver 50, a plate line voltage generator 60, bit lines BL0 to BLm, plate lines PL0 to PLn, and word lines WL0 to WLn.

The memory cell array 10 has memory cells MC arranged in a cross-point configuration. The memory cell MC includes a ferroelectric capacitor. Two or more ferroelectric capacitors are connected to the source of one cell transistor CT, forming one cell block. The cell blocks are arranged in a matrix form. The ferroelectric capacitors in the same column are connected at their one electrode in common to a corresponding one of the bit lines BL0 to BLm through a corresponding one of the cell transistors CT. The ferroelectric capacitors in the same row are connected at their other electrode in common to a corresponding one of the plate lines PL0 to PLn. The cell transistors CT in the same row are connected at their gate in common to a corresponding one of the word lines WL0 to WLn.

The row decoder 20 selects one of the word lines WL0 to WLn in a read or write operation and then drives it high.

Figure 2:
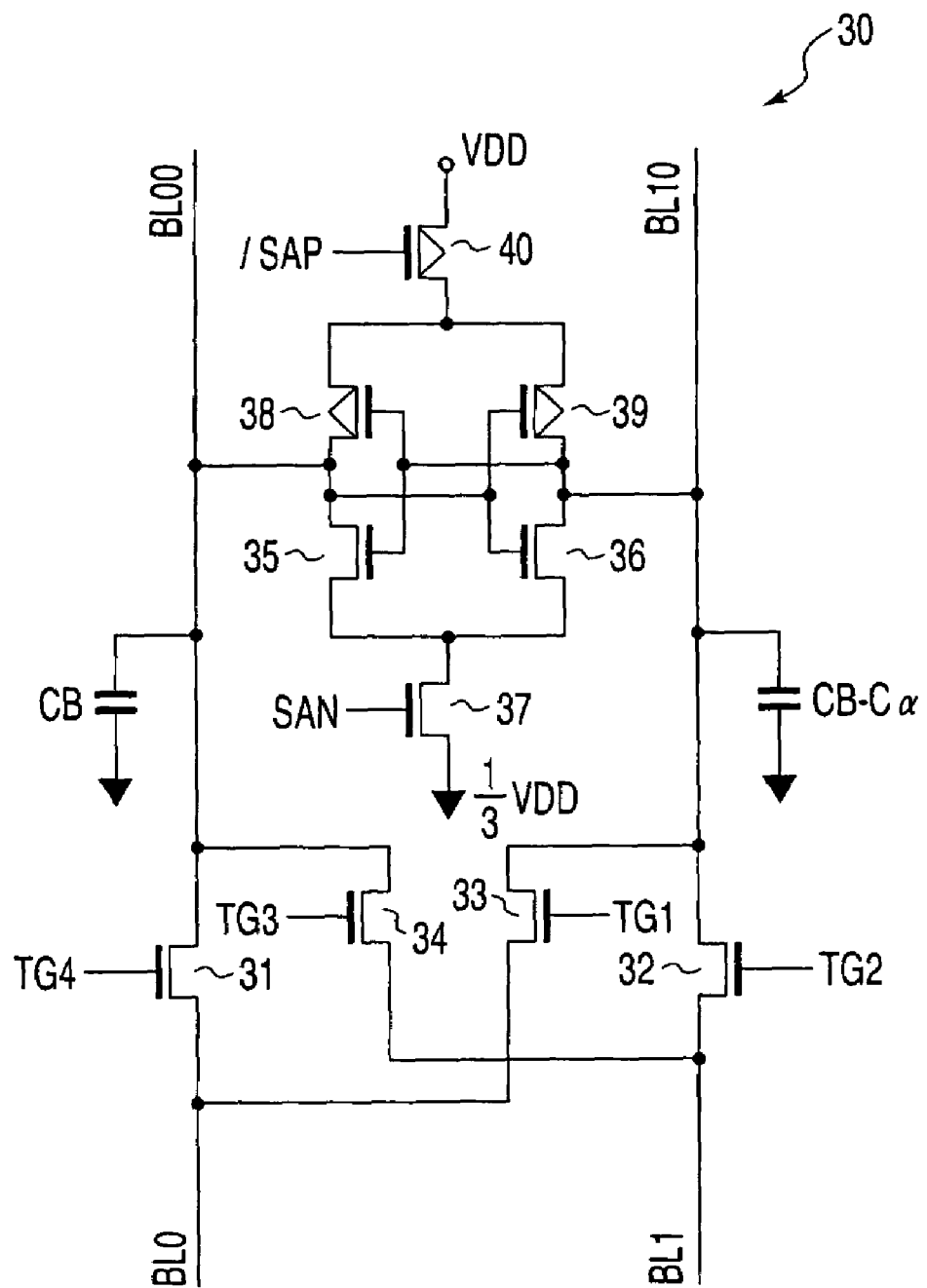
FIG. 2 is a circuit diagram of a sense amplifier of the ferroelectric memory according to the first embodiment of the present invention.

The sense amplifier 30 amplifies a read voltage read onto the corresponding bit line in a read operation. A circuit arrangement of the sense amplifier 30 is illustrated in FIG. 2. The sense amplifiers 30 are each provided for every two bit lines. The circuit arrangement of the sense amplifiers will be described below taking the sense amplifier provided for the bit lines BL0 and BL1 as an example.

The sense amplifier 30 includes n-channel MOS transistors 31 to 37 and p-channel MOS transistors 38, 39 and 40. In the description which follows, the bit line BL0 on the sense amplifier side of the MOS transistor 31 is referred to as the bit line BL00 and the bit line BL1 on the sense amplifier side of the MOS transistor 32 as the bit line BL10.

The MOS transistor 31 has its gate connected to receive a signal TG4, one end of its current path connected to the bit line BL0, and the other end of its current path connected to the bit line BL00. The MOS transistor 32 has its gate connected to receive a signal TG2, one end of its current path connected to the bit line BL1, and the other end of its current path connected to the bit line BL10. The MOS transistor 33 has its gate connected to receive a signal TG1, one end of its current path connected to the bit line BL0, and the other end of its current path connected to the bit line BL10. The MOS transistor 34 has its gate connected to receive a signal TG3, one end of its current path connected to the bit line BL1, and the other end of its current path connected to the bit line BL00. That is, the bit line BL0 and the bit line BL00 are connected through the current path of the MOS transistor 31 and the bit line BL0 and the bit line BL10 are connected through the current path of the MOS transistor 33. Also, the bit line BL1 and the bit line BL10 are connected through the current path of the MOS transistor 32 and the bit line BL1 and the bit line BL00 are connected through the current path of the MOS transistor 34.

The MOS transistor 40 has its gate connected to receive a signal /SAP and its source connected to a high-level supply potential (for example, VDD). The MOS transistor 37 has its gate connected to receive a signal SAN and its source connected to a low-level supply potential (for example, VDD/3). The MOS transistor 38 has its source connected to the drain of the MOS transistor 40, its drain connected to the bit line BL00, and its gate connected to the bit line BL10. The MOS transistor 39 has its source connected to the drain of the MOS transistor 40, its drain connected to the bit line BL10, and its gate connected to the bit line BL00. The MOS transistor 35 has its source connected to the drain of the MOS transistor 37, its drain connected to the bit line BL00, and its gate connected to the bit line BL10. The MOS transistor 36 has its source connected to the drain of the MOS transistor 37, its drain connected to the bit line BL10, and its gate connected to the bit line BL00. That is, the node at which the drains of the MOS transistors 35 and 38 are connected together is connected to the node at which the gates of the MOS transistors 36 and 39 are connected together and to the bit line BL00. Also, the node at which the drains of the MOS transistors 36 and 39 are connected together is connected to the node at which the gates of the MOS transistors 35 and 38 are connected together and to the bit line BL10.

The plate line driver 50 selects one of the plate lines PL0 to PLn in a read or write operation and then drives it to a plate line voltage.

The plate line voltage generator 60 applies the plate line voltage VPL to the plate line driver 50. The circuit arrangement of the plate line voltage generator 60 will be described with reference to FIG. 3.

As shown, the plate line voltage generator 60 includes a disable signal generator 61, p-channel MOS transistors 63, 64 and 68, n-channel MOS transistors 65, 69 and 70, an operational amplifier 62, and resistance elements 66 and 67. The disable signal generator 61 generates a disable signal/DISABLE in a read operation. The disable signal generator 61 includes a delay circuit 61-1 and a NAND gate 61-2. The NAND gate performs a NAND operation on a signal RAS delayed by the delay circuit 61-1 and the signal/SAP to output the disable signal/DISABLE. The signal RAS is one to take in a row address. The MOS transistor 63 has its gate connected to receive the disable signal/DISABLE, its source connected to the high-level supply voltage, and its drain connected to the output of the operational amplifier 62. The MOS transistor 64 has its gate connected to the output of the operational amplifier 62 and the drain of the MOS transistor 63 and its source connected to the high-level supply voltage. The MOS transistor 65 has its gate and drain connected together to the drain of the MOS transistor 64. The resistance elements 66 and 67 are connected in series between the source of the MOS transistor 65 and the low-level supply voltage. The connection node of the resistance elements 66 and 67 is connected to the noninverting input of the operational amplifier 62, which has its inverting input connected to receive a reference voltage Vref.

The MOS transistor 68 has its source connected to the high-level supply voltage and its gate connected to receive a chip enable signal/CE. The MOS transistor 69 has its drain connected to the drain of the MOS transistor 68 and its gate connected to the common drains of the MOS transistors 64 and 65. The MOS transistor 70 has its gate connected to the gate of the MOS transistor 69 and its source and drain connected to the low-level supply voltage. The potential on the source of the MOS transistor 69 is output as the plate line voltage VPL.

In the plate line voltage generator 60 thus arranged, when the source potential of the MOS transistor 69 (hereinafter referred to as the step-down transistor) lowers so that the potential on the connection point of the resistance elements 66 and 67 falls below the reference voltage Vref, the output of the operational amplifier 62 goes low, turning the MOS transistor 64 on. As a result, a voltage is applied to the gate of the step-down transistor 69, and a channel region of the step-down transistor 69 goes into the weak inversion state, causing the plate line voltage VPL to rise.

Next, the read operation of the ferroelectric memory thus arranged will be described by way of an example of reading data out of the memory cell MC00 in FIG. 1. FIG. 4 is a timing chart for various signals on the operation of reading data out of the memory cell MC00.

[Preparation for Readout]

First, at time t0, the chip enable signal/CE set low, making the chip active. Next, to make preparations for data readout, an equalize signal EQ is set low at time t1. As the result, the equalization of the bit lines BL0 and BL1 is removed. The row decoder 20 then receives a row address signal to select the word line WL0 at time t2 (the potential on the word line WL0 is caused to go high). As the result, the cell blocks including the cell transistors connected to the word line WL0 are connected to the bit lines. Next, the signal TG4 is set high at time t3, turning the MOS transistor 31 on. Thereby, the bit line BL0 is electrically connected to the bit line BL00, making a preparation to lead data read from the memory cell into the sense amplifier. At the same time the signal TG4 is set high, the disable signal generator 61 sets the disable signal/DISABLE low. As the result, the MOS transistor 63 in the plate line voltage generator 60 is set to the normally on state. Accordingly, the MOS transistor 64 goes into the off state irrespective of the plate line voltage VPL. In other words, the feedback loop through the operational amplifier 62 becomes disconnected, bringing the plate line voltage VPL out of control of the operational amplifier 62.

[Data Readout from Memory Cell]

Next, at time t4, the plate line driver 50 drives the plate line PL0 to the plate line potential. As the result, charges (data) are read from the memory cell MC00 onto the bit line BL0. At this point, in order not to disturb nonselected memory cells, a plate line voltage lower than the coercive voltage is applied to the selected plate line PL0. After charges have been read onto the bit line BL0, the signal TG4 is set low. Consequently, the MOS transistor 31 goes into the off state and the charges are temporarily stored on the bit line BL00.

[Writing Reference Data into Memory Cell]

Next, at time t7, the plate line driver 50 applies the voltage VDD to the selected plate line PL0 as the plate line voltage in the state where the bit lines BL0 and BL1 are equalized. As the result, "0" is written into the memory cell MC00.

[Readout of Reference Data]

Next, at time t11, the signal TG1 is set high. Thus, the bit line BL0 is electrically connected to the bit line BL10. At this point, the bit line BL0 is electrically isolated from the bit line BL00 by the MOS transistor 31. The signal TG2 remains low and hence the MOS transistor 32 is in the off state. As the result, the bit line BL1 is also electrically isolated from the bit line BL10.

At time t12, the plate line driver 50 selects and drives the plate line PL0 again. The plate line voltage applied to the plate line PL0 at this point is equal to that at time t4. Thereby, "0" as reference data is read onto the bit line BL0. Next, at time t13, the signal TG1 is set low. As the result, the MOS transistor 33 goes into the off state and "0" as reference data is stored on the bit line BL10.

The capacitance (CB−Cα) associated with the bit line BL10 is set smaller than the capacitance (CB) associated with the bit line BL00. Assuming that the bit line potential when "0" is stored on the bit line BL00 is V00, the bit line potential when "1" is stored on the bit line BL00 is V01, and the bit line potential when "0" as reference data is stored on the bit line BL10 is V10, therefore, the following relation holds:

V00<V10<V01

[Comparison and Amplification of Read Data]

Next, at time t15, the data read from the memory cell MC00 onto the bit line BL00 is amplified. That is, the signal/SAP is set low and the signal SAN is set high, enabling the amplification section of the sense amplifier. The data read onto the bit line BL00 is compared and amplified with reference to the reference data read onto the bit line BL10. That is, assuming that the data read onto the bit line BL00 is "0" and V00<V10, the potential on the bit line BL00 is amplified to approximately VDD/3. If, on the other hand, the data read onto the bit line BL00 is "1" and V01>V10, then the potential on the bit line BL00 is amplified to approximately VDD.

[Restoring]

Subsequent to the comparison and amplification in the sense amplifier 30, restoring of data into the selected memory cell is performed. In restoring data, care must be taken not to disturb nonselected memory cells.

First, (⅔)·VDD is applied to the nonselected plate lines. The signal TG4 is set high at time t16 with the sense amplifier 30 activated, thereby connecting the bit line BL00 and the bit line BL0 together. Since "0" has already been written as the reference data, it is not necessary to drive the plate line again. When "1" is to be restored, the bit line BL0 is driven to VDD, allowing "1" to be written into the selected memory cell.

At this point, for nonselected cells, the disturbance can be suppressed to VDD/3 because the bit line potential is VDD and the plate line potential is (⅔)·VDD. When data is "0", the bit line potential goes to VDD/3, which will disturb to the memory cell already written "0". If VDD/3 is below the (XXX) voltage, however, erroneous writing will not occur. For nonselected cells, the disturbance can also be suppressed to VDD/3 because the bit line potential is VDD/3 and the plate line potential is (⅔)·VDD.

Thus, the ferroelectric memory according to the first embodiment of the present invention can achieve high integration densities by using a memory cell array configuration of the cross point type. In addition, the first embodiment can improve the reliability of the readout system in which cell data and reference data are read out of the same cell. The above readout system will be described below together with conventional problems.

Figure 5:
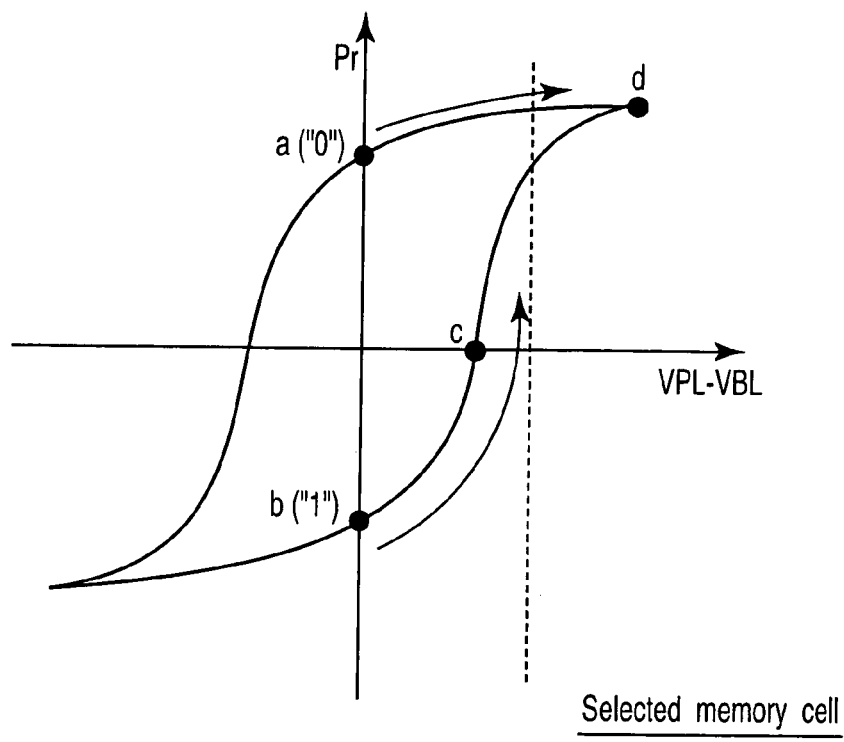
FIG. 5 is a graph indicating a hysteresis loop of the ferroelectric capacitor in the selected memory cell and illustrates the situation when a voltage higher than or equal to the coercive voltage is applied to the selected plate line.

FIG. 5 shows the hysteresis loop of the ferroelectric capacitor of a selected memory cell. When the plate line is driven in order to read data out of the memory cell holding "0", the remanent polarization Pr changes from a to b in FIG. 5. When the memory cell holds "1", the remanent polarization Pr changes from b through c to d in FIG. 5. The change of the remanent polarization Pr appears on the bit line in the form of a potential.

Figure 6:
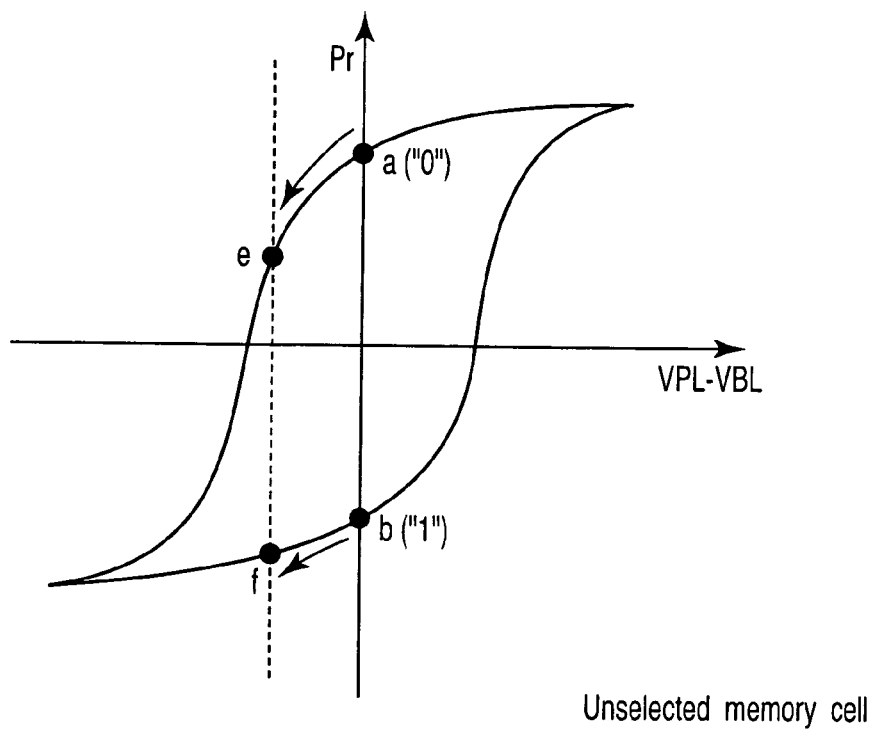
FIG. 6 is a graph indicating the hysteresis loop of the ferroelectric capacitor in the nonselected memory cell and illustrates the situation when a voltage higher than or equal to the coercive voltage is applied to the selected plate line.

With such a cross point type of memory cell array as shown in FIG. 1, a problem is the disturbance to nonselected memory cells due to data read out of a selected memory cell. In particularly, when the selected memory cell holds "1", an electric field is produced between the bit line onto which "1" has been read out and the nonselected bit lines fixed at 0V as shown in FIG. 6 because the plate lines of the nonselected memory cells are fixed at 0V. That is, the effect of the disturbance is such that, as shown in FIG. 6, with nonselected memory cells holding "0", the remanent polarization changes from a to e and, with nonselected memory cells holding "1", the remanent polarization changes from b to f. The disturbance works in a direction to weak data in the nonselected memory cells. Therefore, when the coercive voltage of the ferroelectric capacitors of memory cells is low and the effect of the disturbance is great, erroneous reading may occur.

Here, consider an application of a method, which involves using a selected memory cell itself as a reference potential generating cell, temporarily writing "0" into the selected memory cell after cell data has been read out to lighten the bit line capacitance, and reading "0" as a reference potential, to the cross point type of memory cell array. According to this method, it becomes possible to solve a problem that each of the ferroelectric and paraelectric components of a ferroelectric capacitor greatly varies for each memory cell and the paraelectric capacitor is difficult to use as a reference potential generating circuit. The reason is that these varying components can be canceled by using the selected memory cell as the reference cell.

With the cross point type of memory cell array, however, it is required to take the effect of disturbance on nonselected memory cells into consideration as describe above. That is, the plate lines must not be driven greatly and the plate line potential needs to be set below the coercive voltage of the hysteresis loop. This is illustrated in FIGS. 7 and 8. FIG. 7 shows the hysteresis loop of the ferroelectric capacitor of a selected memory cell, while FIG. 8 shows the hysteresis loop of the ferroelectric capacitor of a nonselected memory cell. As shown, the disturbance to nonselected memory cells can be suppressed by using the plate line voltage lower than the coercive voltage.

When the plate line voltage is set below the coercive voltage in order to reduce the effect of disturbance on nonselected cells, the bit line potential when "0" or "1" is read out becomes smaller than that when a voltage higher than or equal to the coercive voltage is applied to the plate line. Thus, if, when "0" is written into a memory cell from which cell data has been read and then read as a reference potential, voltages needed for readout, (for example, the plate line voltage and the supply voltage of the sense amplifier) fluctuate, accurate readout becomes impossible.

Figure 9:
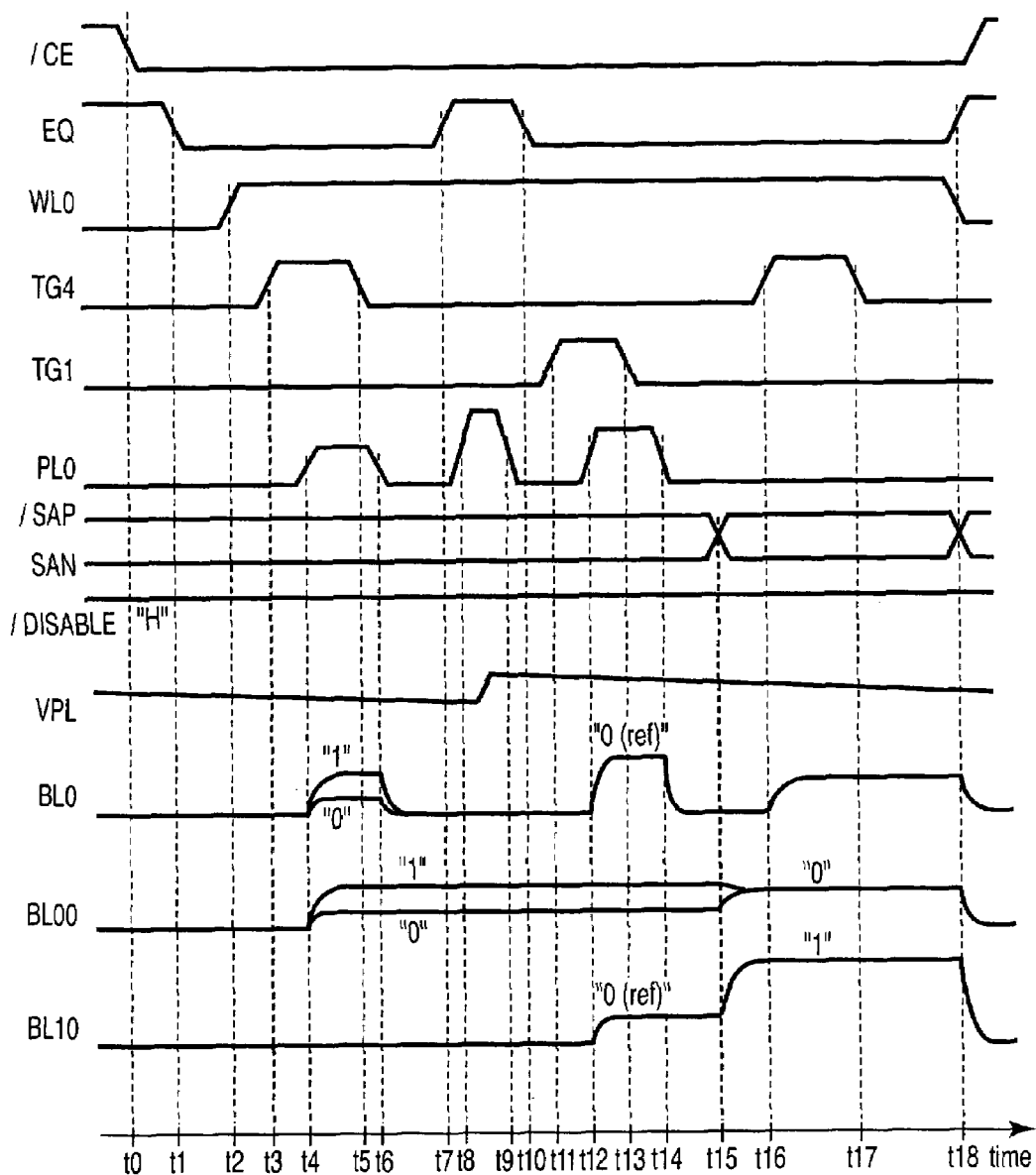
FIG. 9 is a timing chart for various signals when a conventional ferroelectric memory is in a read operation.

That is, by using the plate line voltage lower than the coercive voltage as described previously, the values for V00, V10 and V01 and the difference between each value become small. Thus, the occurrence of fluctuation of the plate line potential disorders the relation such that V00<V10<V01, causing erroneous readout to occur. This is illustrated in FIG. 9. As shown, the plate line potential VPL is changed sharply between time t8 prior to readout of the reference potential and time t9 after readout of the reference potential. With the conventional technique in which the operational amplifier 62 is normally enabled, this is attributed to a change in the output of the operational amplifier between t8 and t9 which causes the plate line voltage VPL from the transistor 69 to change sharply. When the plate line potential when cell data is read out of the selected memory cell at time t4 becomes higher than the plate line potential when reference data is read at time t12, the reference potential corresponding to "0" may become higher than the bit line potential when "1" is read as cell data. In that case, the read data would be recognized as "0" irrespective of data the selected memory cell holds.

Figure 3:
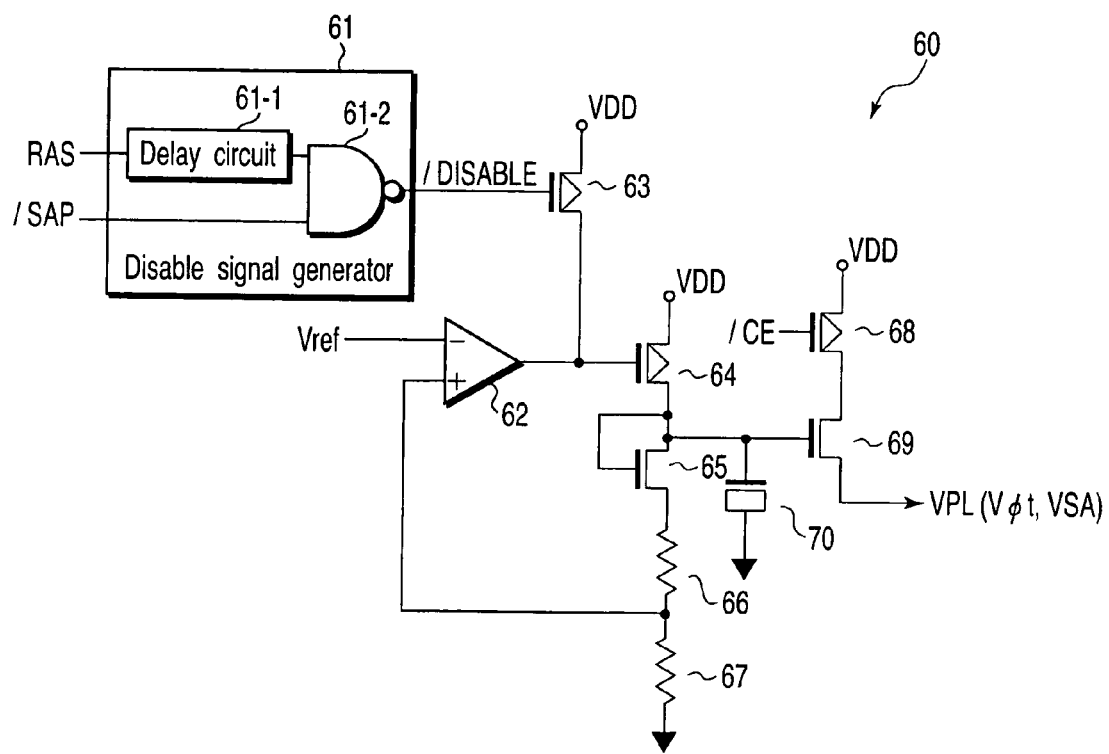
FIG. 3 is a circuit diagram of a plate line voltage generator shown in FIG. 1.

With the circuit arrangement of this embodiment in which the disable signal generator 61 is provided, the operational amplifier 62 is disabled at least for the time interval from readout of cell data until reference data has been read. More specifically, as shown in FIG. 3, the potential at the output of the operational amplifier 52 is fixed at a constant level (a high level) by setting the p-channel MOS transistor 63 to the on state. As a result, as shown in FIG. 4, the plate line voltage VPL will not change sharply during the interval from readout of cell data until completion of reference data readout and its rate of change with respect to time becomes constant. Therefore, even when the values of V00, V10 and V01 are made small, the relation such that V00<V10<V01 is not disordered and an accurate read operation can be performed by setting the plate line voltage lower than the coercive voltage.

Figure 10:
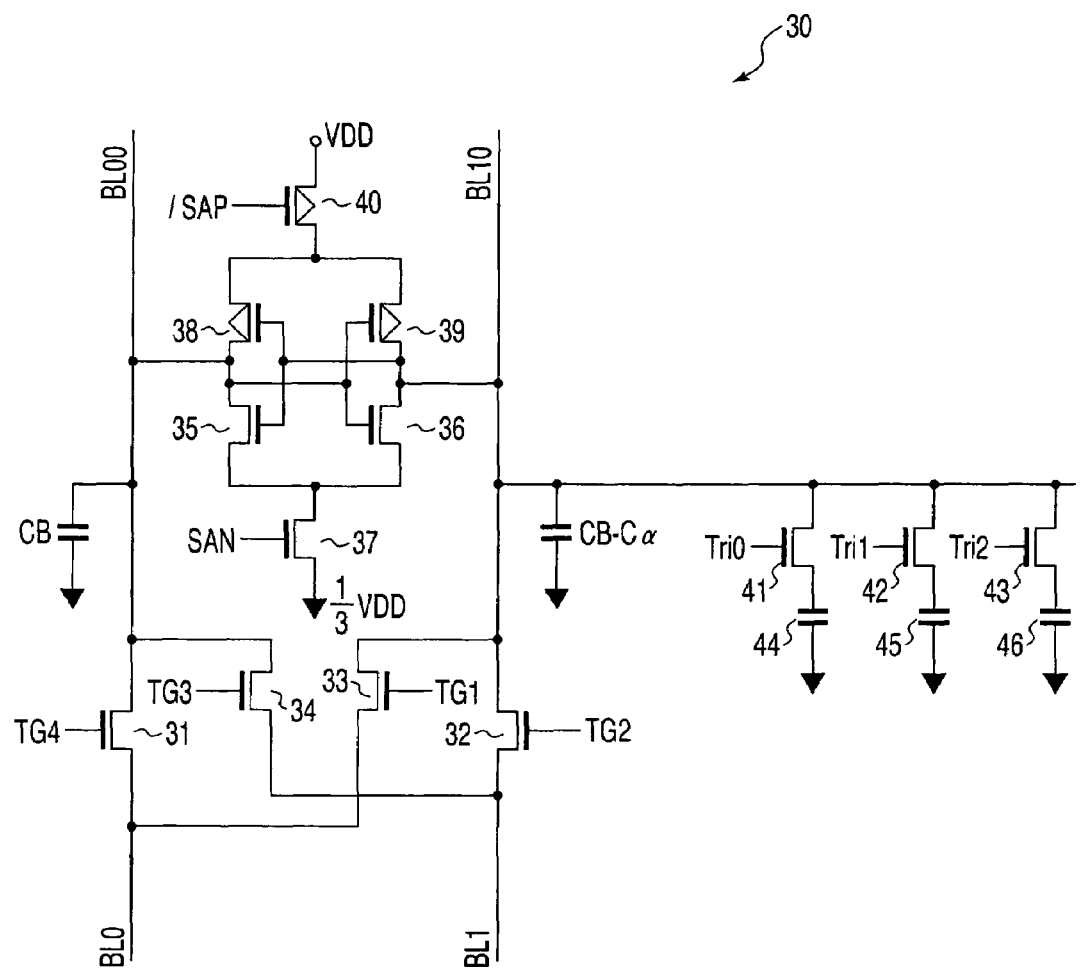
FIG. 10 is a circuit diagram of a sense amplifier of a ferroelectric memory according to a first modification of the first embodiment of the present invention.

FIG. 10 is a circuit diagram of the sense amplifier 30 in a ferroelectric memory according to a first modification of this embodiment. As shown, n-channel MOS transistors 41, 42, and 43 and capacitance elements 44, 45, and 46 are added to the arrangement described in conjunction with FIG. 2. The n-channel MOS transistors 41 to 43 have their drains connected to the bit line BL10, their sources connected to the capacitance elements 44 to 46, respectively, and their gates connected to receive signals Tri0, Tri1, and Tri2, respectively.

In the above arrangement, by controlling the signals Tri0 to Tri2, capacitors can be further connected to the bit line BL10 to control the capacitance associated with the bit line BL10. Although, in FIG. 10, the capacitors are indicated to be three in number, this is illustrative and not restrictive.

Figure 11:
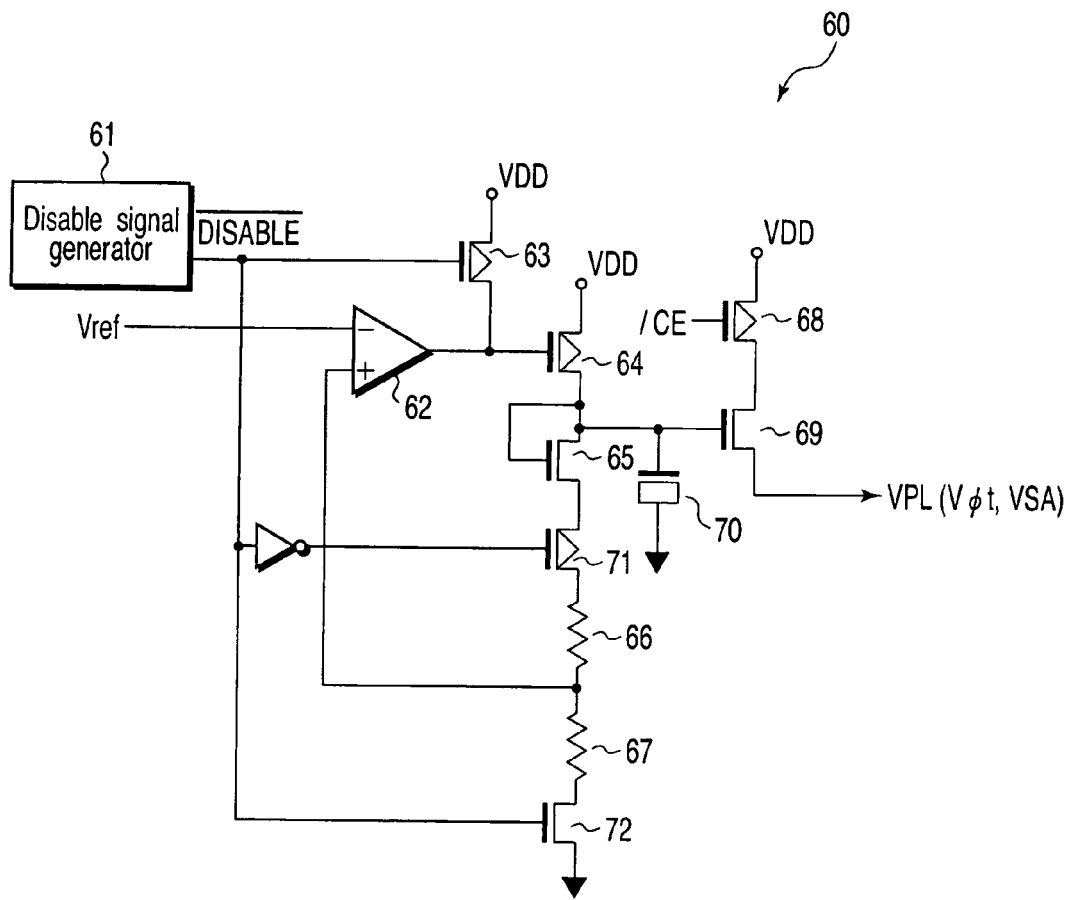
FIG. 11 is a circuit diagram of a plate line voltage generator of a ferroelectric memory according to a second modification of the first embodiment of the present invention.

FIG. 11 is a circuit diagram of the plate line voltage generator 60 in a ferroelectric memory according to a second modification of this embodiment. In this modification, a p-channel MOS transistor 71 is connected between the MOS transistor 65 and the resistance element 66 and an n-channel MOS transistor 72 is connected between the resistance element 67 and ground potential in the arrangement of the plate line voltage generator 60 described in conjunction with FIG. 3. The MOS transistor 71 has its gate connected to receive the disable signal DISABLE through an inverter and the MOS transistor 72 has its gate connected to receive the disable signal/DISABLE. Such an arrangement will provide the same advantage as the arrangement of FIG. 3. This modification causes no current flow from the resistance elements 66 and 67 to ground potential, allowing a reduction in power dissipation to be achieved.

The plate line voltage generator of this embodiment described above is constructed so as not to cause the plate line voltage to fluctuate. The arrangement of the plate line voltage generator of this embodiment is also applicable to circuits adapted to generate voltages other than plate line voltages. The arrangement is preferably applied to circuits which generate signals to be supplied in a read operation, for example, the power supply circuit for the sense amplifier and the circuit which generates the signals TG1 to TG4.

A ferroelectric memory according to a second embodiment of the present invention will be described next. In the ferroelectric memory of the second embodiment, such a plate line voltage generator 60 as shown in FIG. 12 is applied to the arrangements of the first embodiment and the first modification. The other arrangement remains unchanged from the first embodiment and the first modification and hence a description thereof is omitted.

In the plate line voltage generator 60 of the second embodiment, the MOS transistors 65, 68 and 69 used in the arrangement shown in FIG. 3 are removed and the potential on the connection node of the drain of the MOS transistor 64 and the resistance element 66 is used as the plate line voltage VPL. This arrangement is of a so-called pMOS feedback type.

The arrangement of this embodiment can provide the same operation and the same advantages as in the first embodiment.

FIG. 13 is a circuit diagram of the plate line voltage generator 60 according to a modification of the second embodiment. In this plate line voltage generator, the MOS transistors 65, 68 and 69 used in the arrangement of FIG. 11 are removed. Such an arrangement can provide the same advantages as in the first embodiment.

The arrangement of this plate line voltage generator is also applicable to the sense amplifier power supply circuit and the word line voltage generator.

Figure 14:
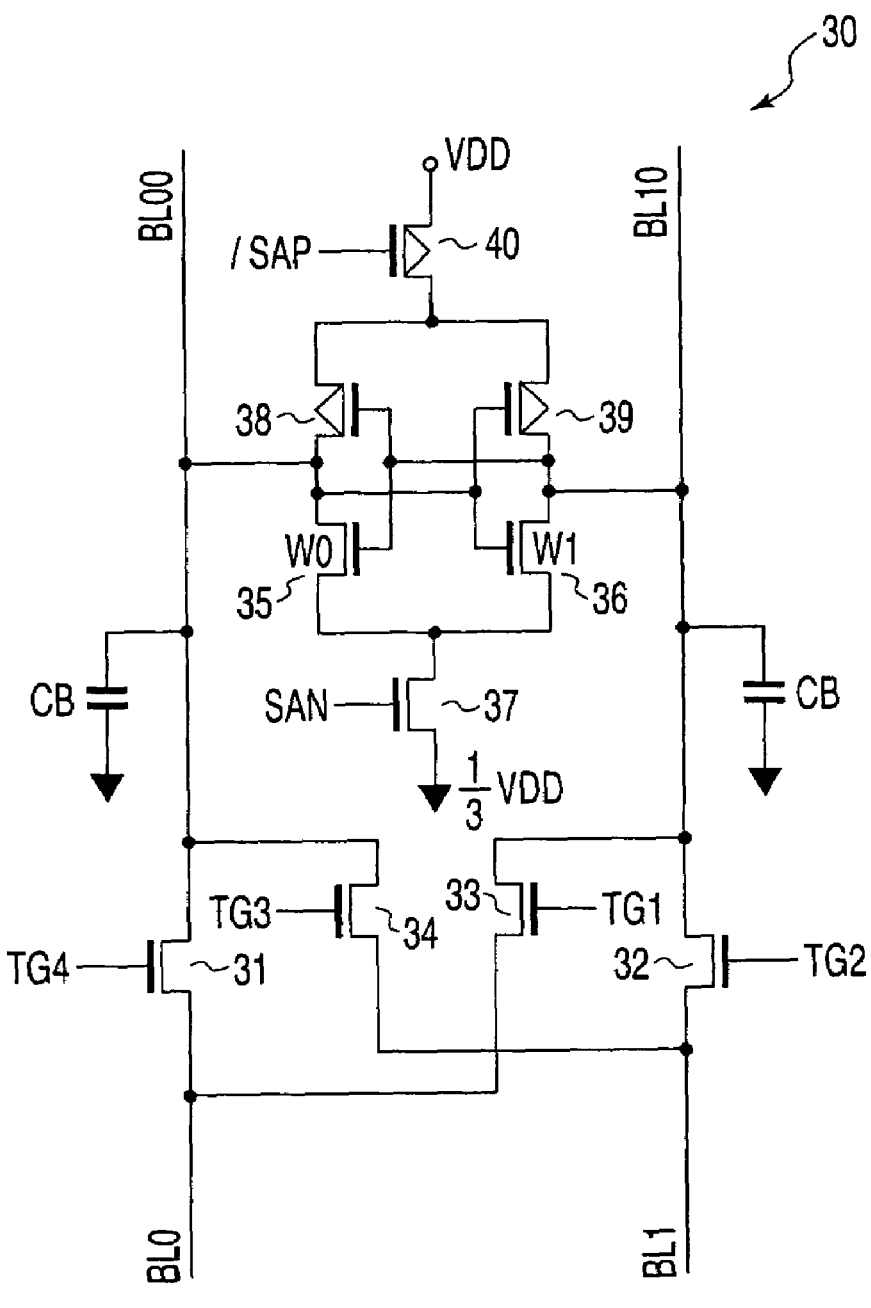
FIG. 14 shows a circuit diagram of a sense amplifier of a ferroelectric memory according to a third embodiment of the present invention.

A ferroelectric memory according to a third embodiment of the present invention will be described next. In this ferroelectric memory, such a sense amplifier as shown in FIG. 14 is applied to the first embodiment or the second modification of the first embodiment. The other arrangement remains unchanged from the first embodiment and the first modification and hence a description thereof is omitted.

The sense amplifier 30 shown in FIG. 14 remains unchanged in arrangement from the sense amplifier shown in FIG. 2. However, the gate widths W0 and W1 of the respective MOS transistors 35 and 36 are set such that $$W0 > W1$$

In addition, the capacitances associated with the bit lines BL00 and BL10 are each set equal to CB.

Figure 15:
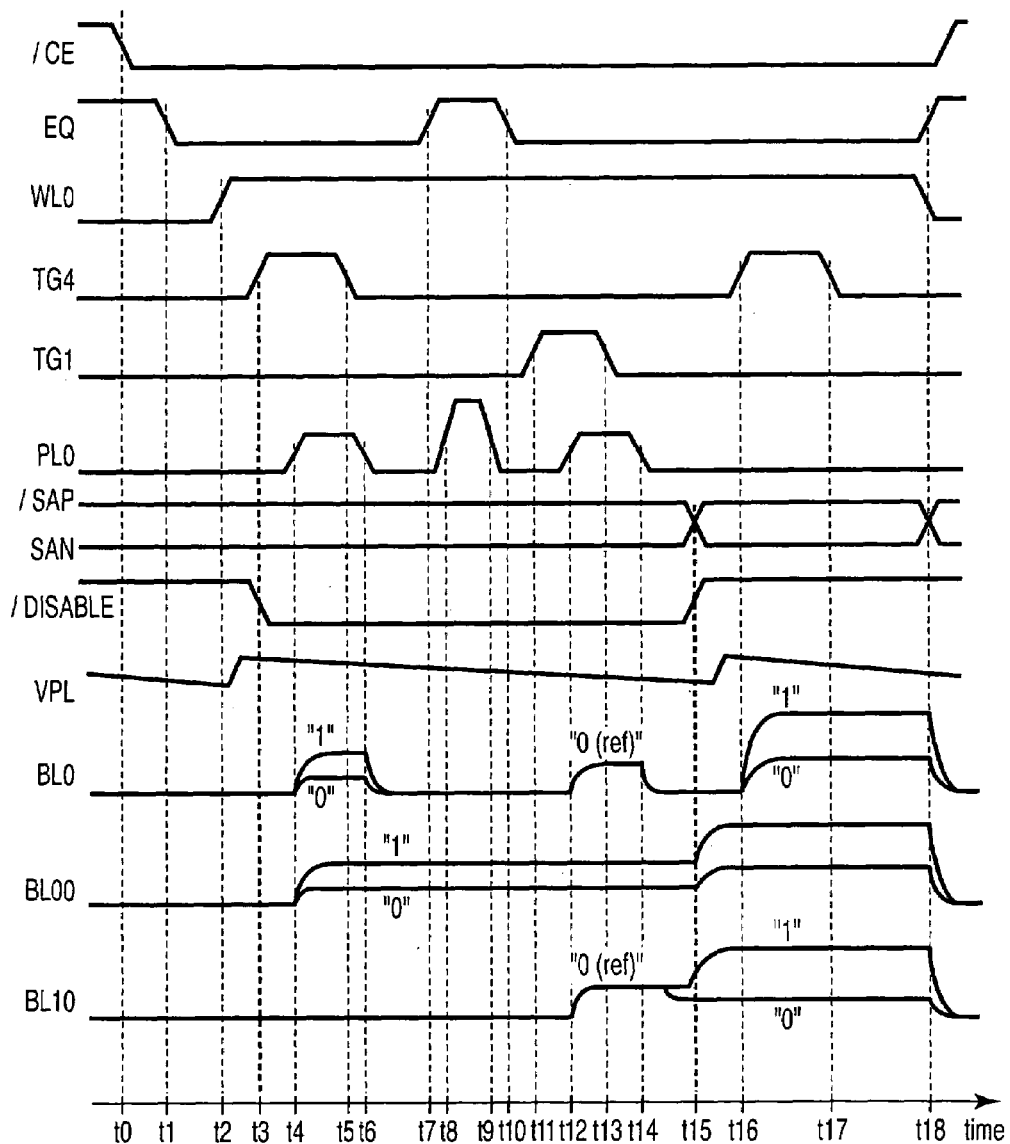
FIG. 15 is a timing chart for various signals when the ferroelectric memory according to the third embodiment is in a read operation.

The operation of the ferroelectric memory of this embodiment will be described with reference to FIG. 15, which is a timing chart for various signals on the read operation. The preparation for data readout, data readout from a memory cell, writing reference data into the memory cell, and reference data readout are the same as those in the first embodiment.

At time t15, the signals/SAP and SAN are set low and high, respectively, with the result that the amplifying section of the sense amplifier 30 is activated to make comparison and amplification of read data. Since the gate width W0 of the MOS transistor 35 is set larger than the gate width W1 of the MOS transistor 36, when "0" is drawn into the bit lines BL00 and BL10, the bit line BL01 is drawn to a lower-voltage side than the bit line BL10. The reason is that, when "0" is drawn into the bit line BL10, it is supplied with the low-level supply voltage through the MOS transistor 36 of small gate width, whereas, when "0" is drawn into the bit line BL00, it is supplied with the low-level supply voltage through the MOS transistor 35 of large gate width. As the result, although the capacitances associated with the bit lines BL00 and BL10 are set equal to each other, as in the first embodiment, the following relation holds:

$$V00 < V10 < V01$$

where V00 is the bit line potential when "0" is stored on the bit line BL00, V01 is the bit line potential when "1" is stored on the bit line BL00, and V10 is the bit line potential when "0" as reference data is stored on the bit line BL10.

After that, data restoring is carried out in accordance with the method described in the first embodiment and the read operation is completed.

As described above, in the ferroelectric memory of this embodiment, the gate widths W0 and W1 of the MOS transistors 35 and 36 in the sense amplifier are set such that W0>W1 and moreover the plate line voltage generator described in the first embodiment or the second modification is used. For this reason, erroneous data reading can be prevented.

Figure 16:
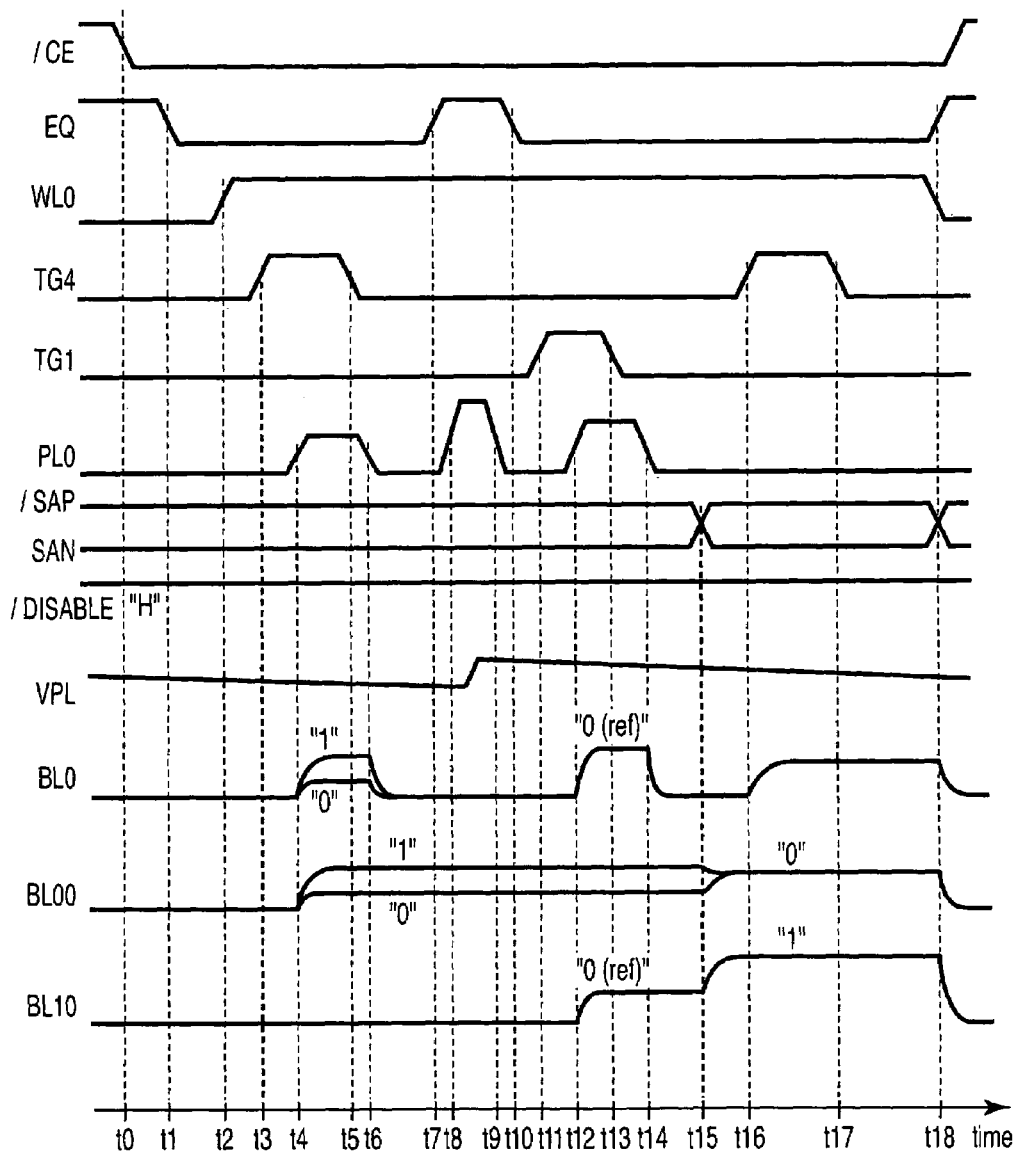
FIG. 16 is a timing chart for various signals when a conventional ferroelectric memory is in a read operation.

FIG. 16 is a timing chart for various signals when the operational amplifier 61 in the plate line voltage generator 60 is normally enabled in the ferroelectric memory using the sense amplifier according to the third embodiment. As shown, if the output voltage of the operational amplifier 61 falls or rises before and after readout of reference data, erroneous readout may occur.

Even in this embodiment, the same arrangement as the plate line voltage generator is also applicable to circuits which generate the sense amplifier supply voltage and word line voltages.

A ferroelectric memory according to a fourth embodiment of the present invention will be described next. This embodiment is a combination of the first embodiment, the second embodiment or its modification, and the third embodiment. That is, the plate line voltage generator shown in FIG. 12 or 13 and the sense amplifier shown in FIG. 14 are used in the ferroelectric memory of the first embodiment.

The fourth embodiment can provide the same operation as the third embodiment. In addition, as described in the second embodiment, the operational amplifier 61 in the plate line voltage generator 60 can be disabled for the time interval from readout of cell data until reference data has been read. The fourth embodiment can therefore provide the same advantages as the second and third embodiments.

Even in this embodiment, the same arrangement as the plate line voltage generator is also applicable to circuits which generate the sense amplifier supply voltage and word line voltages.

A ferroelectric memory according to a fifth embodiment of the present invention will be described next. This embodiment is a combination of the first embodiment, or its second modification, and a sense amplifier shown in FIG. 17.

Figure 17:
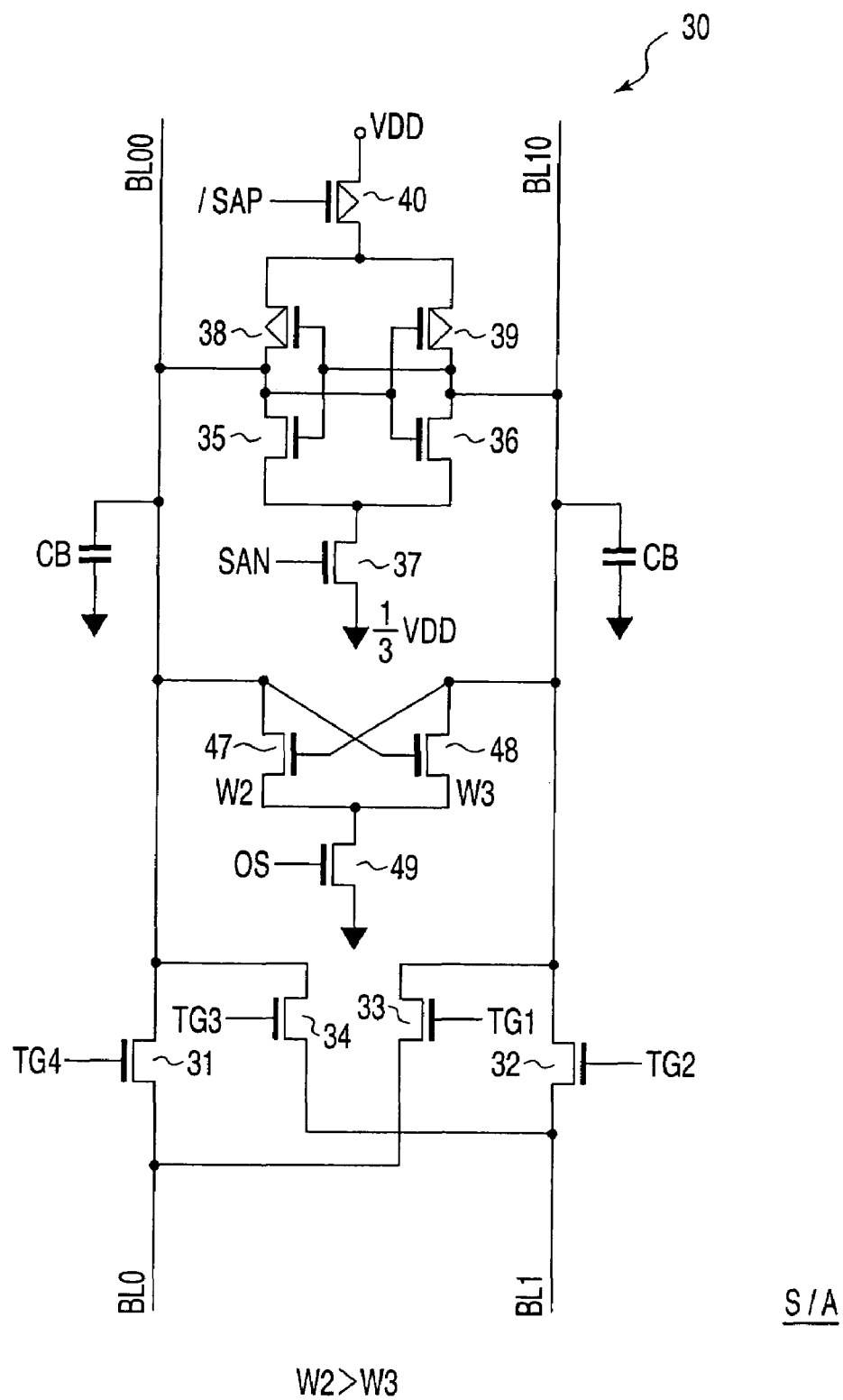
FIG. 17 is a circuit diagram of a sense amplifier of a ferroelectric memory according to a fifth embodiment of the present invention.

As shown in FIG. 17, the sense amplifier 30 has n-channel MOS transistors 47, 48 and 49 added to the circuit arrangement shown in FIG. 2. The MOS transistor 47 has its drain connected to the bit line BL00 and the gate of the MOS transistor 48 and its gate connected to the bit line BL10. The MOS transistor 48 has its drain connected to the bit line BL10 and the gate of the MOS transistor 47 and its gate connected to the bit line BL00. The MOS transistors 47 and 48 have their sources connected together. The MOS transistor 49 has its drain connected to the common sources of the MOS transistors 47 and 48, its source connected to the low-level supply potential, and its gate connected to receive a signal OS.

In the sense amplifier thus arranged, the capacitances CB associated with the bit lines BL00 and BL10 are set equal to each other. The gate widths W2 and W3 of the respective MOS transistors 47 and 48 are related by $$W2>W3$$

Figure 18:
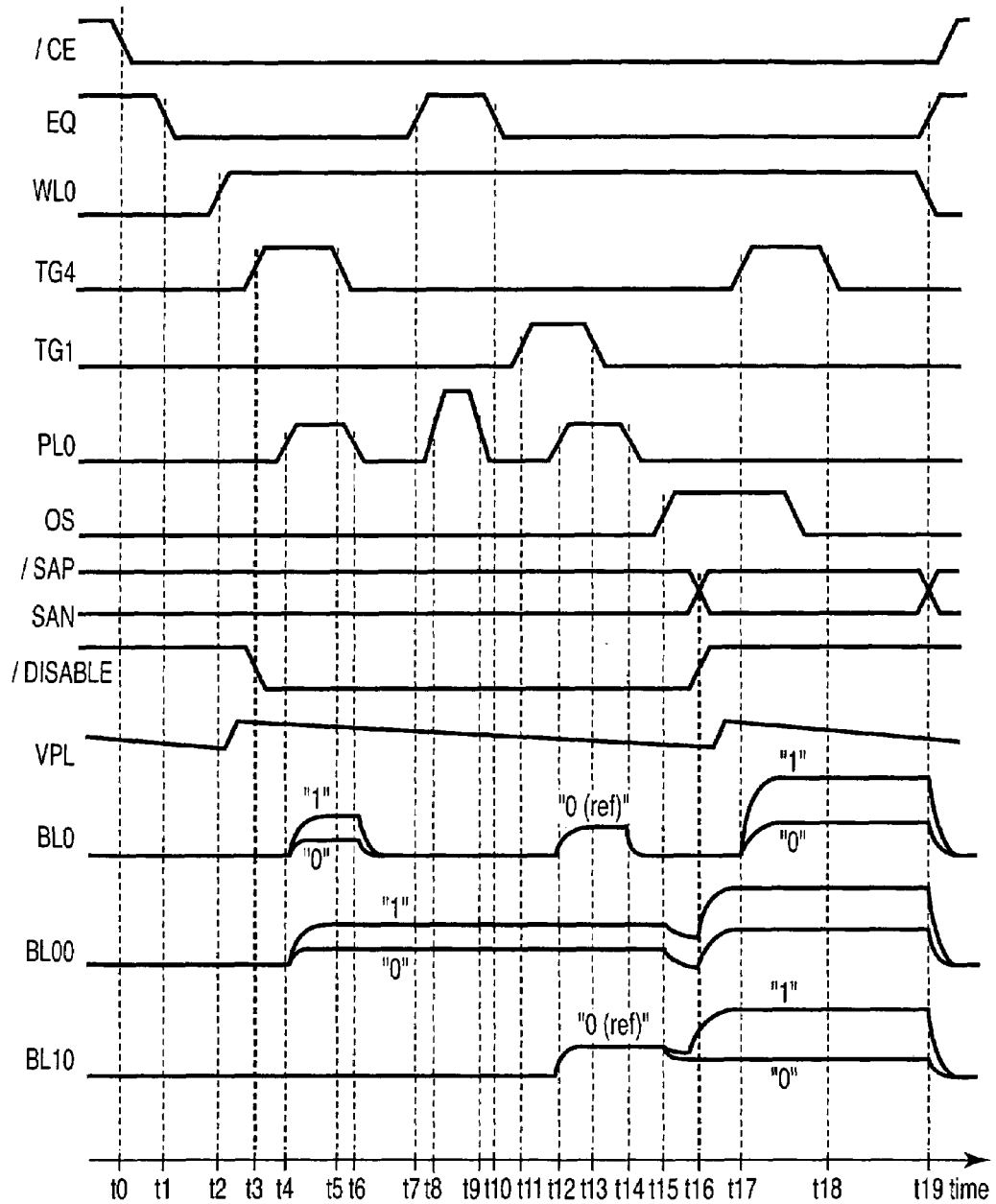
FIG. 18 is a timing chart for various signals when the ferroelectric memory according to the fifth embodiment is in a read operation.

The operation of the ferroelectric memory according to this embodiment will be described below with reference to FIG. 18, which is a timing chart for various signals on the read operation of the memory. The preparation for data readout, data readout from a memory cell, writing reference data into the memory cell, and reference data readout are the same as those in the first embodiment.

At time t15 after the completion of readout of reference data and before the signals /SAP and SAN are set low and high, respectively, the signal OS is set high. Thereby, the MOS transistor 49 in the sense amplifier 30 is turned on. At this point, if "0" is read onto the bit line BL00, the potential of the bit line BL00 is drawn to a lower-potential side than the bit line BL10 because the gate width W2 of the MOS transistor 47 is set larger than the gate width W3 of the MOS transistor 48. Conversely, if "1" is read onto the bit line BL00, the potential of the bit line BL10 is drawn to a lower-potential side because the MOS transistor 48 is turned on. As the result, although the capacitances associated with the bit lines BL00 and BL10 are set equal to each other, as in the first embodiment, the following relation holds:

$$V00<V10<V01$$

where V00 is the bit line potential when "0" is stored on the bit line BL00, V01 is the bit line potential when "1" is stored on the bit line BL00, and V10 is the bit line potential when "0" as reference data is stored on the bit line BL10.

At time t16 after the potential difference between the bit lines BL00 and BL10 has been previously made large, the signals /SAP and SAN are set low and high, respectively, activating the amplifying section of the sense amplifier 30 to make comparison and amplification of read data. After that, data restoring is carried out in accordance with the method described in the first embodiment and the read operation is completed.

As described above, in the ferroelectric memory of this embodiment, the gate widths W2 and W3 of the MOS transistors 47 and 48 in the sense amplifier are set such that W2>W3 and moreover the plate line voltage generator described in the first embodiment or the second modification is used. For this reason, erroneous data reading can be prevented.

Figure 19:
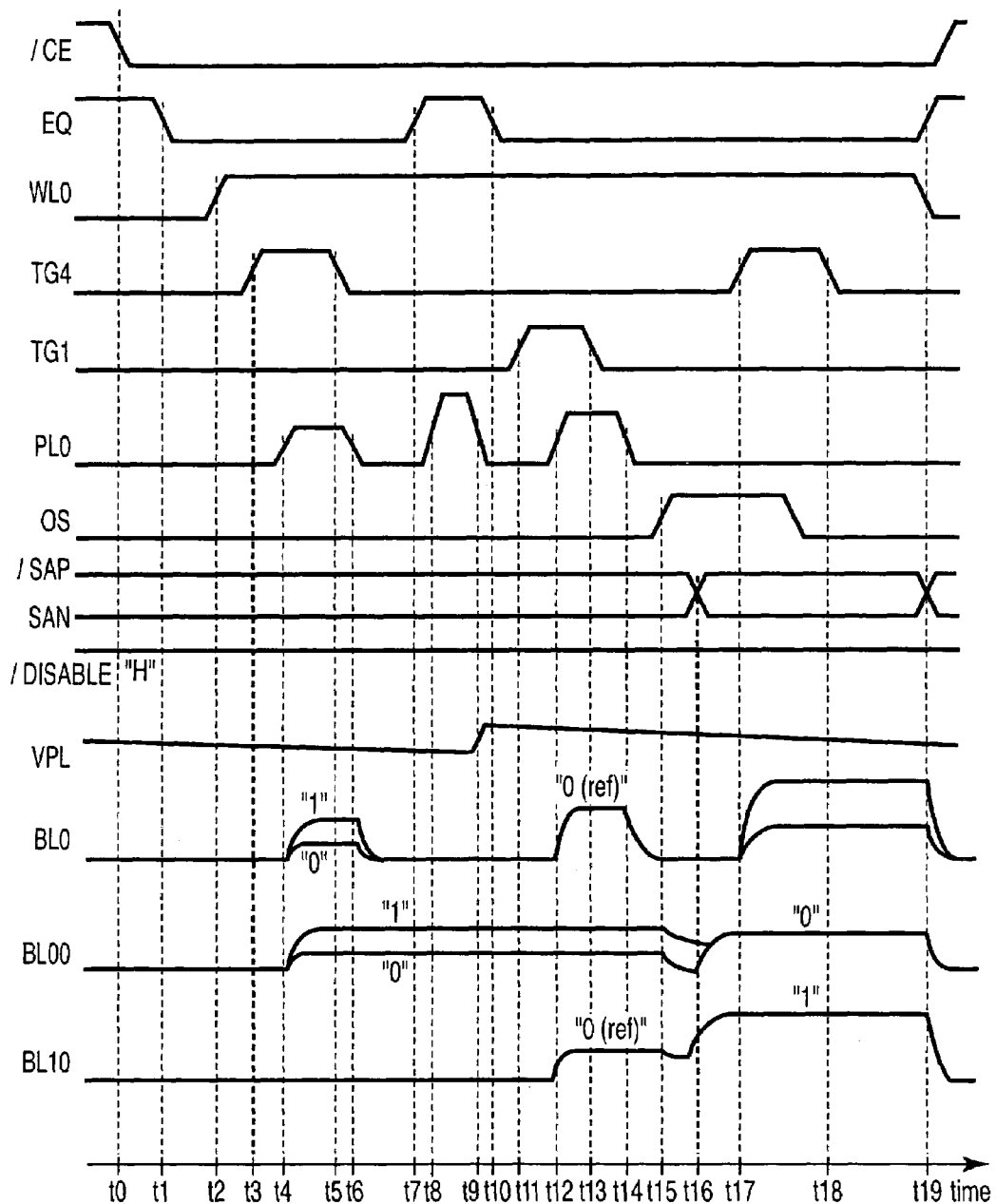
FIG. 19 is a timing chart for various signals when a conventional ferroelectric memory is in a read operation.

FIG. 19 is a timing chart for various signals on the read operation when the operational amplifier 61 in the plate line voltage generator 60 is normally enabled in the ferroelectric memory using the sense amplifier according to this embodiment. As shown, the output voltage of the operational amplifier 61 falls or rises before and after readout of reference data, erroneous readout may occur.

Even in this embodiment, the same arrangement as the plate line voltage generator is also applicable to circuits which generate the sense amplifier supply voltage and word line voltages.

A ferroelectric memory according to a sixth embodiment of the present invention will be described next. This embodiment is a combination of the first embodiment, the second embodiment or its modification, and the fifth embodiment. That is, the plate line voltage generator shown in FIG. 12 or 13 and the sense amplifier shown in FIG. 17 are used in the ferroelectric memory of the first embodiment.

The sixth embodiment can provide the same operation as the fifth embodiment. In addition, as described in the second embodiment, the operational amplifier 61 in the plate line voltage generator 60 can be disabled for the time interval from readout of cell data until reference data has been read. The sixth embodiment can therefore provide the same advantages as the second and fifth embodiments.

Even in this embodiment, the same arrangement as the plate line voltage generator is also applicable to circuits which generate the sense amplifier supply voltage and word line voltages.

Figure 20:
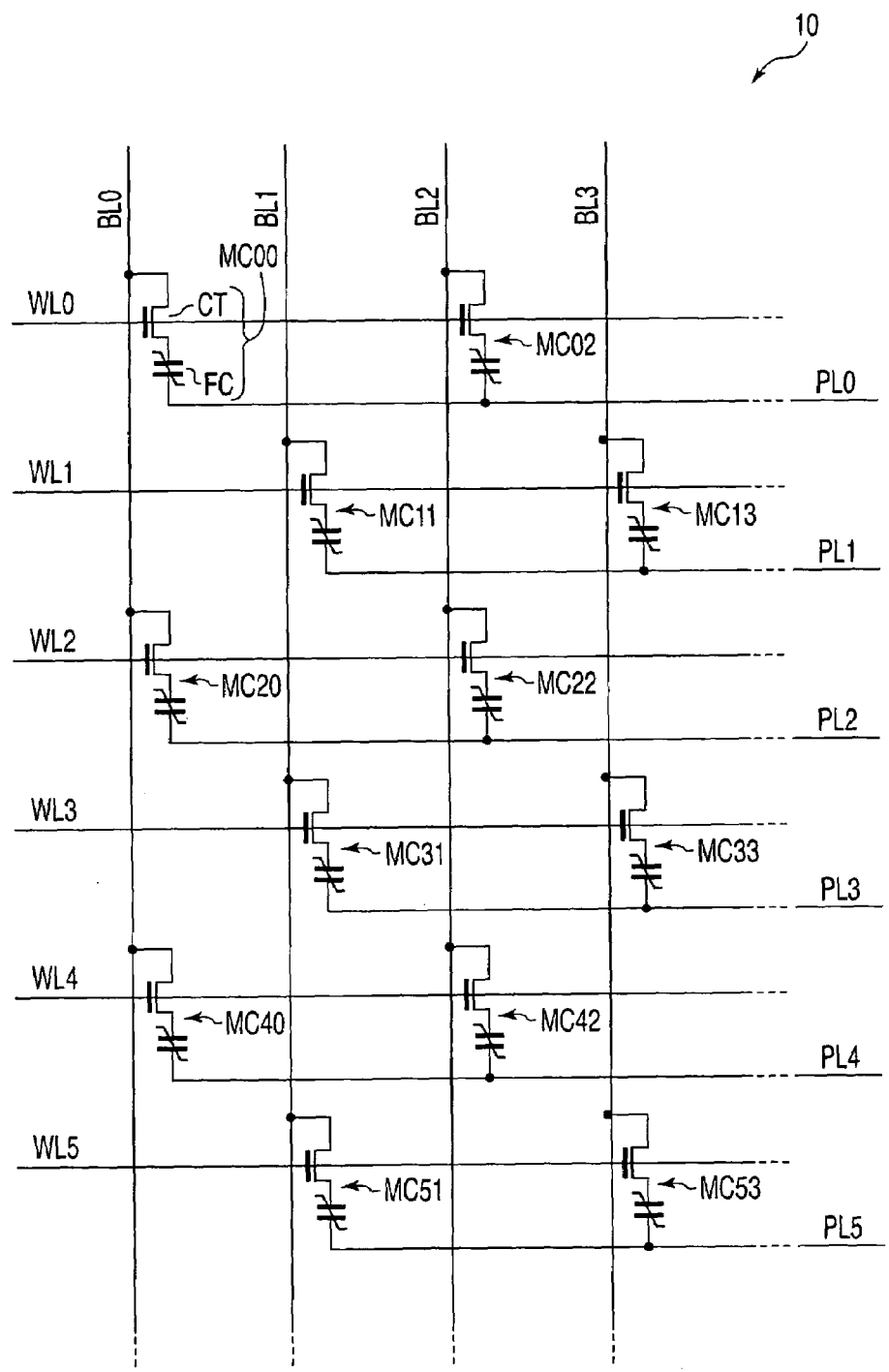
FIG. 20 is a circuit diagram of the memory cell array of a ferroelectric memory according to a seventh embodiment of the present invention.

A ferroelectric memory according to a seventh embodiment of the present invention will be described next. In this embodiment, the memory cell array is formed from memory cells of the 1T/1C (one-transistor and one-capacitor) type on the structure according to the first embodiment or its first and second modification. FIG. 20 is a circuit diagram of the memory cell array 10 according to the seventh embodiment.

As shown in FIG. 20, the memory cells MC are arranged in the form of a stagger pattern in the memory cell 10. Each of the memory cells MC has a cell transistor CT and a ferroelectric capacitor FC. The source of the cell transistor CT is connected to one electrode of the ferroelectric capacitor FC. The drains of the cell transistors CT arranged in the same column are connected in common to a corresponding respective one of the bit lines BL0 to BLm. The gates of the cell transistors CT arranged in the same row are connected in common to a corresponding respective one of the word lines WL0 to WLn. The other electrodes of the ferroelectric capacitors FC of the memory cells MC in the same row are connected in common to a corresponding respective one of the plate lines PL0 to PLn. In this manner, the same folded bit line type of memory cell array as a DRAM is formed.

The circuit arrangements of the sense amplifier 30 and the plate line voltage generator 60 remain unchanged from those in the first embodiment and the first and second modifications and hence descriptions thereof are omitted.

Figure 21:
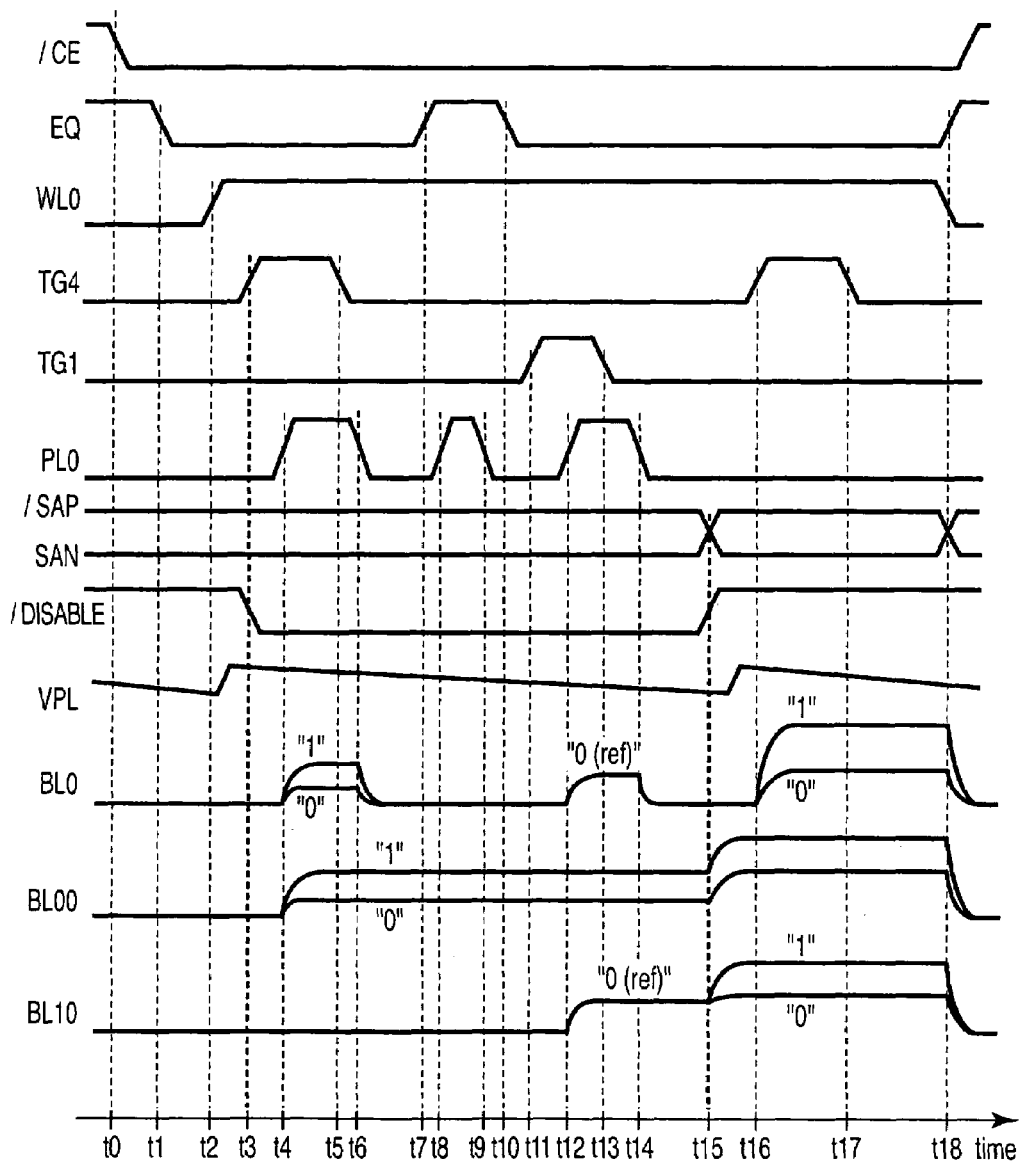
FIG. 21 is a timing chart for various signals when the ferroelectric memory according to the seventh embodiment is in a read operation.

Next, the operation of this ferroelectric memory thus arranged will be described by way of an example of reading data out of the memory cell MC00. FIG. 21 is a timing chart for various signals on the operation of reading data out of the memory cell MC00.

[Data Readout from Memory Cell]

The preparation for readout is the same as with the first embodiment. After the preparation for readout, the plate line driver 50 drives the plate line PL0 to the plate line potential at time t4. As the result, charges (data) are read from the memory cell MC00 onto the bit line BL0. With this embodiment, the same folded bit line type of memory cell array 10 as a DRAM eliminates the need to consider the effect of disturbance on nonselected memory cells. For this reason, the plate line potential can be set higher than or equal to the coercive voltage. After the charges have been read out onto the bit line BL0, the signal TG4 is set low to turn the MOS transistor 31 off. Thus, the charges are temporarily stored on the bit line BL00.

[Writing Reference Data into Memory Cell]

Next, at time t8, the plate line driver 50 applies the voltage VDD to the selected plate line PL0 as the plate line voltage with the bit lines BL0 and BL1 equalized. As the result, "0" is written into the memory cell MC00.

[Readout of Reference Data]

Next, at time t11, the signal TG1 is set high. Thus, the bit line BL0 is electrically connected to the bit line BL10. At this point, the bit line BL0 is electrically isolated from the bit line BL00 by the MOS transistor 31. The signal TG2 remains low and hence the MOS transistor 32 is in the off state. Thus, the bit line BL1 is also electrically isolated from the bit line BL10.

At time t12, the plate line driver 50 drives the plate line PL0 again. The plate line voltage applied to the plate line PL0 at this point is equal to that at time t4. That is, the plate voltage can be set higher than or equal to the coercive voltage. Thereby, "0" as reference data is read onto the bit line BL0. Next, at time t13, the signal TG1 is set low. As the result, the MOS transistor 33 goes into the off state and "0" as reference data is stored on the bit line BL10.

The capacitance (CB−Cα) associated with the bit line BL10 is set smaller than the capacitance (CB) associated with the bit line BL00. Assuming that the bit line potential when "0" is stored on the bit line BL00 is V00, the bit line potential when "1" is stored on the bit line BL00 is V01, and the bit line potential when "0" as reference data is stored on the bit line BL10 is V10, therefore, the following relation holds:

V00<V10<V01

[Comparison and Amplification of Read Data]

Next, at time t15, the data read from the memory cell MC00 onto the bit line BL00 is amplified. That is, the signal/SAP is set low and the signal SAN is set high, enabling the amplification section of the sense amplifier. The data read onto the bit line BL00 is amplified with reference to the reference data read onto the bit line BL10. That is, assuming that the data read onto the bit line BL00 is 0 and V00<V10, the potential on the bit line BL00 is amplified to approximately VDD/3. If, on the other hand, the data read onto the bit line BL00 is "1" and V01>V10, then the potential on the bit line BL00 is amplified to approximately VDD.

[Restoring]

Subsequent to the comparison and amplification in the sense amplifier 30, restoring of data into the selected memory cell is performed. As has been described in the first embodiment, writing of "0" has already been performed as the writing of the reference data, it is not necessary to drive the plate line again. Thus, the bit lines are set at 0V to retain the already written "0". When "1" is to be rewritten, the potential on the bit line BL0 is set to VDD, allowing "1" to be written into the selected memory cell.

As described above, the ferroelectric memory according to the seventh embodiment of the present invention allows the reliability of read operation to be increased. This point will be described below.

Figure 22:
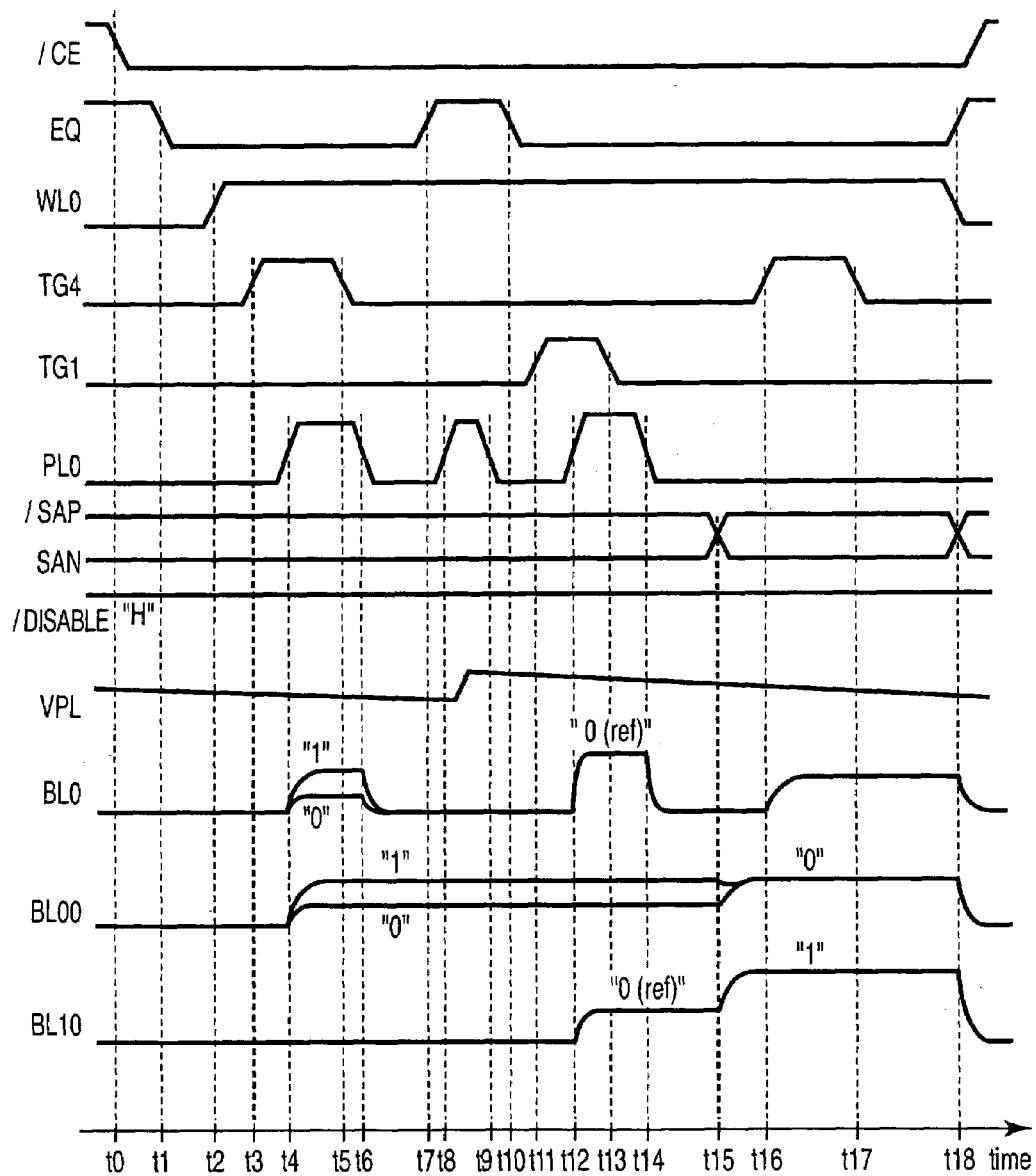
FIG. 22 is a timing chart for various signals when a conventional ferroelectric memory is in a read operation.

With the folded bit line type of memory cell array as in this embodiment, the plate line voltage can be set higher than or equal to the coercive voltage. In comparison with the first through sixth embodiments, therefore, the values of V00, V10 and V01 are large and the difference between each value is also large. As shown in a timing chart of FIG. 22, however, if the plate line voltage VPL fluctuates before and after reading of reference data, there still arises the possibility that erroneous readout may occur.

With the circuit arrangement of this embodiment in which the disable signal generator 61 is provided, the operational amplifier 62 is disabled at least for the time interval from readout of cell data until reference data has been read. Therefore, the relation such that V00<V10<V01 is not disordered and an accurate read operation can be performed.

Even in this embodiment, the same arrangement as the plate line voltage generator is also applicable to circuits which generate the sense amplifier supply voltage and word line voltages.

A ferroelectric memory according to an eighth embodiment of the present invention will be described next. This embodiment is a combination of the first embodiment, the second embodiment, and the seventh embodiment. That is, the memory cell array shown in FIG. 20, the sense amplifier shown in FIG. 2 and the plate line voltage generator shown in FIG. 12 or 13 are used in combination.

The eighth embodiment can provide the same operation as the seventh embodiment. In addition, as described in the second embodiment, the operational amplifier 61 in the plate line voltage generator 60 can be disabled for the time interval from readout of cell data until reference data has been read. The eighth embodiment can therefore provide the same advantages as the second and seventh embodiments.

Even in this embodiment, the same arrangement as the plate line voltage generator is also applicable to circuits which generate the sense amplifier supply voltage and word line voltages.

Figure 23:
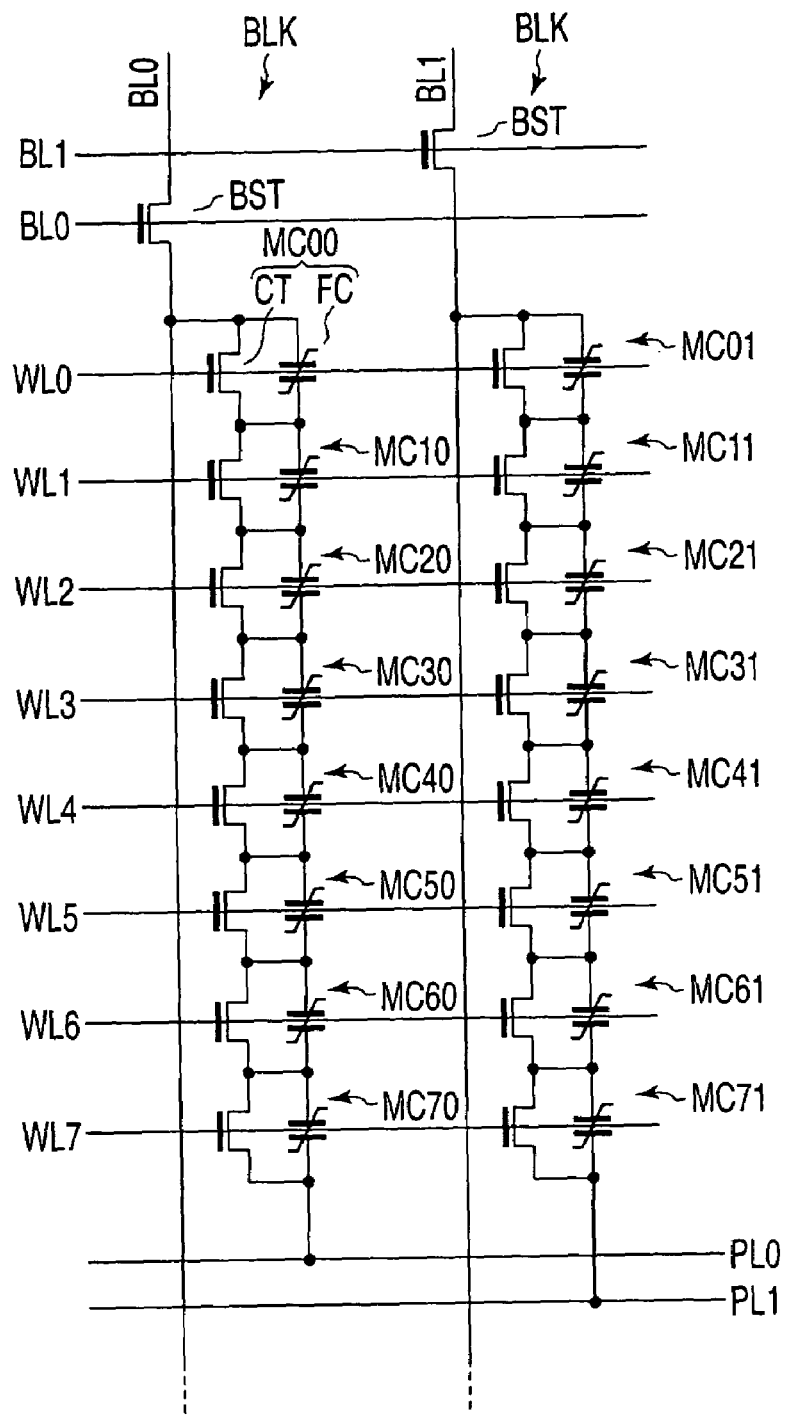
FIG. 23 is a circuit diagram of a sense amplifier of a ferroelectric memory according to a ninth embodiment of the present invention.

A ferroelectric memory according to a ninth embodiment of the present invention will be described next. This ferroelectric memory is an application of the arrangements described in the first embodiment or its first and second modifications to a memory which consists of series connected memory cells each having a transistor (T) having a source terminal and a drain terminal and a ferroelectric capacitor (C) inbetween said two terminals, hereafter named "series connected TC unit type ferroelectric RAM". FIG. 23 shows a circuit arrangement of the series connected TC unit type ferroelectric RAM.

The memory cell array 10 has memory cell blocks BLK arranged in a matrix form. Note that only two memory cell blocks BLK are illustrated in FIG. 23. The number of memory cell blocks is not particularly limited. Each of the memory cell blocks BLK comprises two or more memory cells MC and a block select transistor BST. In FIG. 23, the number of memory cells MC in each cell block is eight; however, this is not restrictive. The number of memory cells may be 16 or 32. Each of the memory cells MC comprises a cell transistor CT and a ferroelectric capacitor FC. The ferroelectric capacitor FC has its one electrode connected to the source of the corresponding cell transistor T and its other electrode connected to the drain. Each of the cell transistors T in each cell block has its source connected to the drain of the cell transistor next to it on one side and its drain connected to the source of the cell transistor next to it on the other side. The cell transistors in the memory cells MC arranged in the same row have their gates connected to a corresponding respective one of the word lines WL0 to WLn. In each of the cell blocks BLK arranged in the same column, the drain of the cell transistor CT of the topmost memory cell MC (e.g., MC00) is connected through the block select transistor BST to a corresponding respective one of the bit lines BL0 to BLm. In each of the cell blocks BLK arranged in the same column, the drain of the cell transistor CT of the bottommost memory cell MC (e.g., MC70) is connected to a corresponding one of the plate lines PL0 to PL1. Alternate ones of the cell blocks BLK arranged in the same row are connected in common to the same plate line. The gate of each of the block select transistors BST is connected to a corresponding one of the bit select signal lines BS0 to BS1. Alternate ones of the cell blocks BLK arranged in the same row are connected to the same block select signal line.

The circuit arrangements of the sense amplifier and the plate line voltage generator are the same as those in the first embodiment or its first and second modifications and hence descriptions thereof are omitted.

Figure 24:
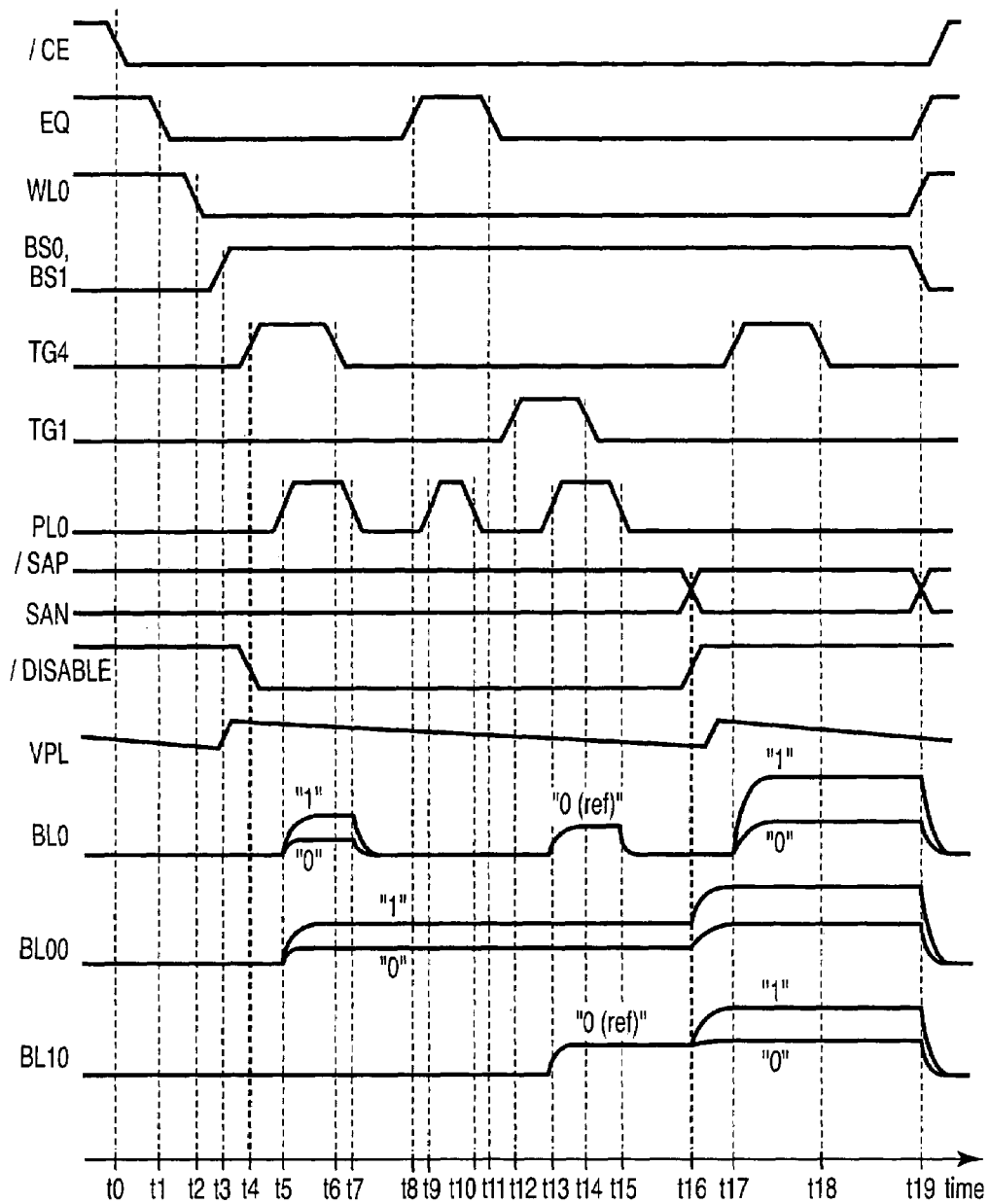
FIG. 24 is a timing chart for various signals when the ferroelectric memory according to the ninth embodiment is in a read operation.

Next, the operation of this ferroelectric memory thus arranged will be described by way of an example of reading data out of the memory cell MC00. FIG. 24 is a timing chart for various signals on the operation of reading data out of the memory cell MC00.

[Preparation for Readout]

The chip enable signal /CE is set low and then the equalize signal EQ is set low. After that, the row decoder 20 responds to a row address signal to select the word line WL0 and drives it low. The block select signal lines BS0 and BS1 are selected and set high. As the result, the block select transistors BST are turned on. After that, the signal TG4 is set high at time t4, turning the MOS transistor 31 on. Thereby, the sense amplifier is ready to take in the read data from the memory cell MC00. In addition, the disable signal /DISABLE is set low, disabling the operational amplifier 62 in the plate line voltage generator 60.

The subsequent data readout from the memory cell, writing reference data into the memory cell, and reference data readout, comparison and amplification of read data and rewriting are the same as those in the seventh embodiment.

Figure 25:
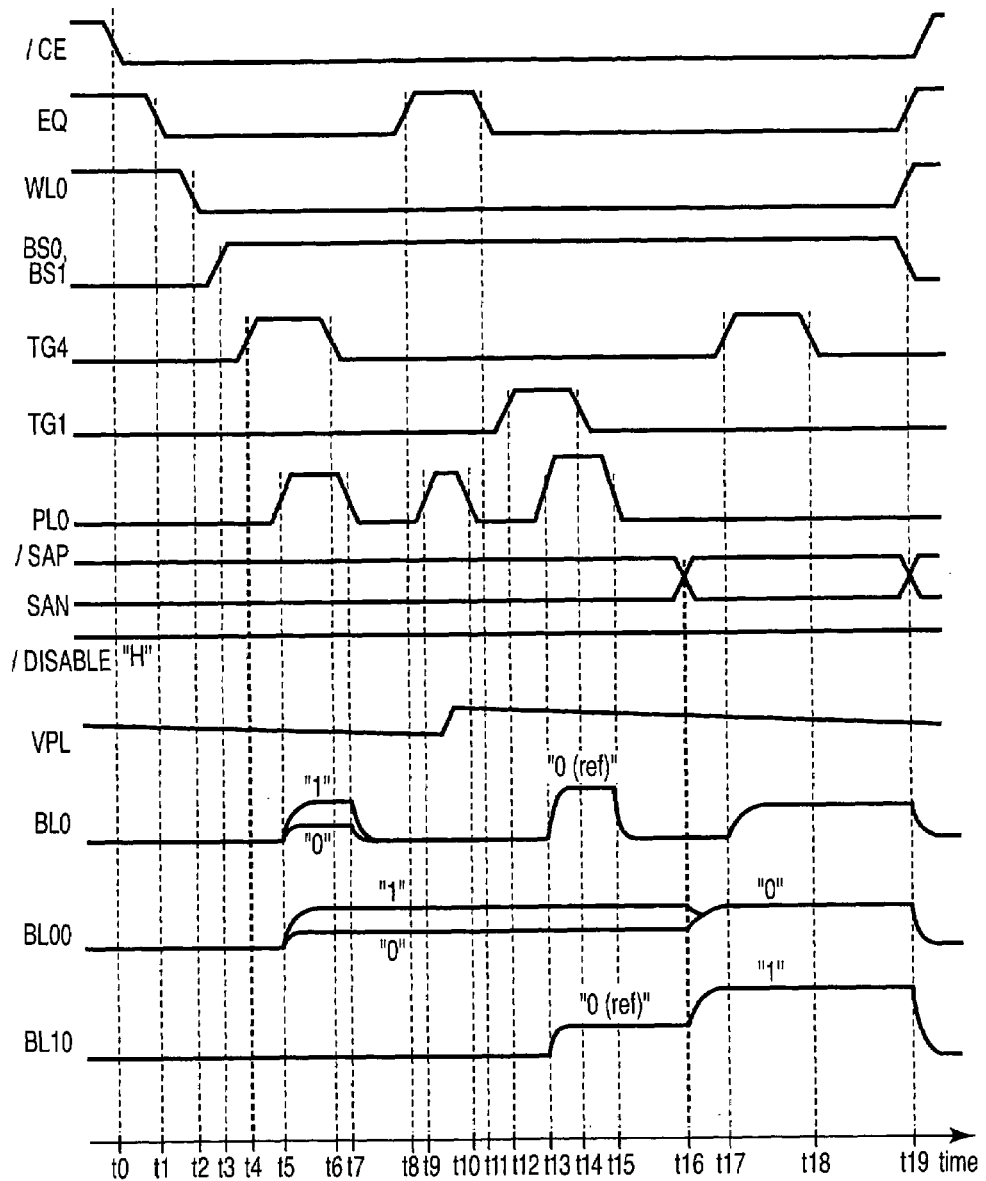
FIG. 25 is a timing chart for various signals when a conventional ferroelectric memory is in a read operation.

As described above, the ferroelectric memory of the ninth embodiment can offer the same advantages as the seventh embodiment. That is, the series connected TC unit type ferroelectric RAM shown in FIG. 23 can drive the plate line with a voltage higher than or equal to the coercive voltage. In comparison with the first through sixth embodiments, therefore, the values of V00, V10 and V01 are large and the difference between each value is also large. As shown in a timing chart of FIG. 25, however, if the plate line voltage VPL fluctuates before and after reading of reference data, there still arises the possibility of erroneous readout.

With the circuit arrangement of this embodiment in which the disable signal generator 61 is provided, the operational amplifier 62 is disabled at least for the time interval from readout of cell data until reference data has been read. Therefore, the relation such that V00<V10<V01 is not disordered and an accurate read operation can be performed.

Even in this embodiment, the same arrangement as the plate line voltage generator is also applicable to circuits which generate the sense amplifier supply voltage and word line voltages.

A ferroelectric memory according to a tenth embodiment of the present invention will be described next. This embodiment is a combination of the first embodiment, the second embodiment, and the ninth embodiment. That is, the memory cell array shown in FIG. 23, the sense amplifier shown in FIG. 2 and the plate line voltage generator shown in FIG. 12 or 13 are used in combination.

The tenth embodiment can provide the same operation as the ninth embodiment. In addition, as described in the second embodiment, the operational amplifier 61 in the plate line voltage generator 60 can be disabled for the time interval from readout of cell data until reference data has been read. The tenth embodiment can therefore provide the same advantages as the second and ninth embodiments.

Even in this embodiment, the same arrangement as the plate line voltage generator is also applicable to circuits which generate the sense amplifier supply voltage and word line voltages.

Figure 26:
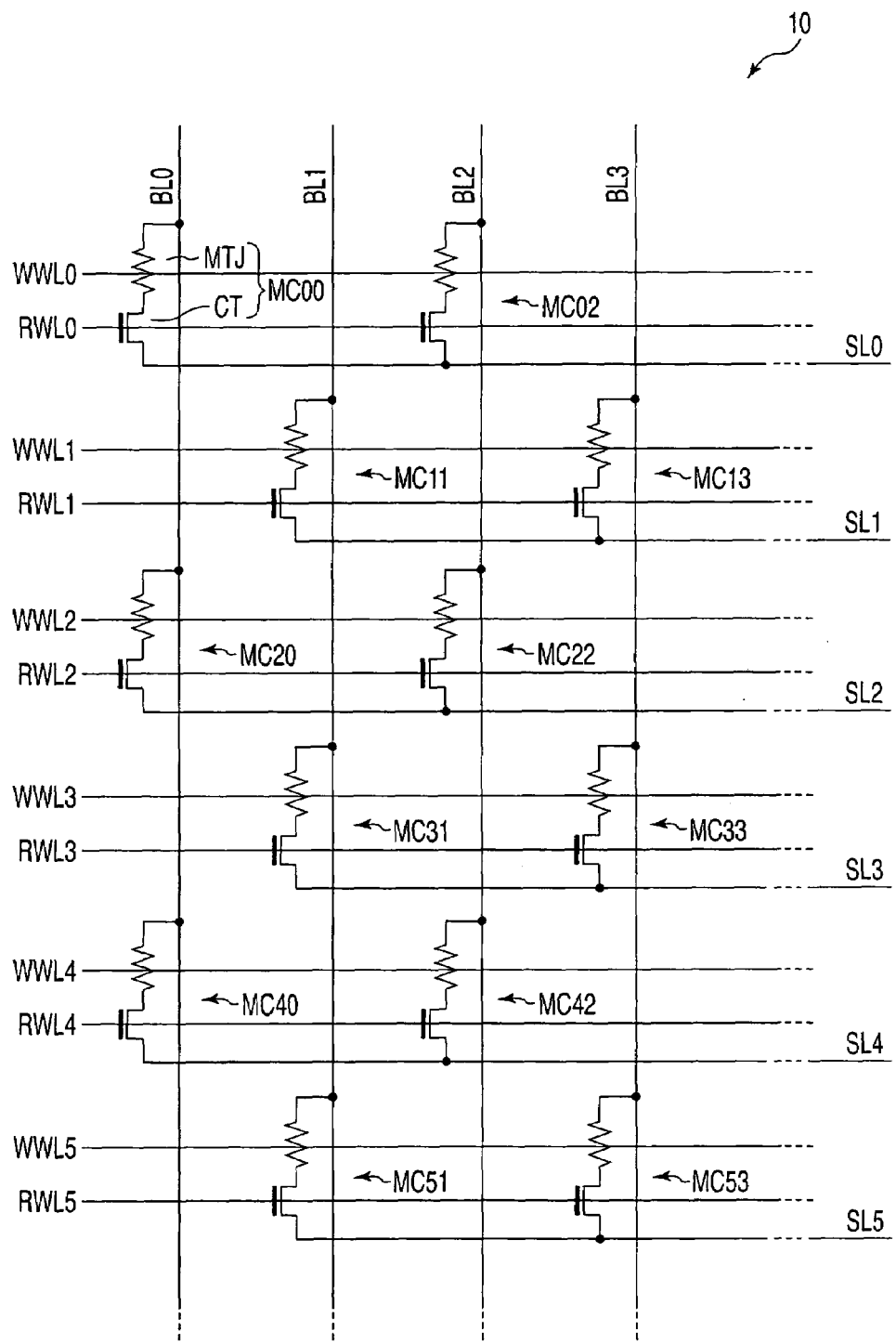
FIG. 26 is a circuit diagram of the memory cell array of an MRAM according to a eleventh embodiment of the present invention.

A magnetic random access memory (MRAM) according to an eleventh embodiment of the present invention will be described next. This embodiment is an application of the arrangements described in the first embodiment and its first and second modifications to an MRAM and is configured such that the plate line voltage generator and the plate line driver 50 are replaced with a source line voltage generator and a source line driver, respectively. FIG. 26 shows a circuit arrangement of the memory cell array 10 of the MRAM of this embodiment.

As shown, the memory cell array 10 is configured such that a number of memory cells MC is arranged in the form of a stagger pattern. Each of the memory cells MC comprises a cell transistor CT and a magneto-resistive element (hereinafter referred to as the MTJ element). Each of the cell transistors CT has its drain connected to one end of the corresponding MTJ element. The other ends of the MTJ elements in the memory cells MC arranged in the same column are connected in common to a corresponding one of the bit lines BL0 to BLm. The gates of the cell transistors CT in the memory cells MC arranged in the same row are connected in common to a corresponding one of the read word lines RWL0 to RWLn. The sources of the cell transistors CT in the memory cells MC arranged in the same row are connected in common to a corresponding one of the source lines SL0 to SLn. Further, write word lines WWL0 to WWLn is disposed in the vicinity of the memory cell in the same row. In this manner, the same folded bit line type of memory cell array as a DRAM is formed.

The circuit arrangements of the sense amplifier 30 and the source line voltage generator 60 remain unchanged from those in the first embodiment and its first and second modifications and hence descriptions thereof are omitted. That is, the plate line voltage generator can be used as the source line voltage generator as it is.

In a read or write operation, the source line driver selects one of the source lines SL0 to SLn.

Figure 27:
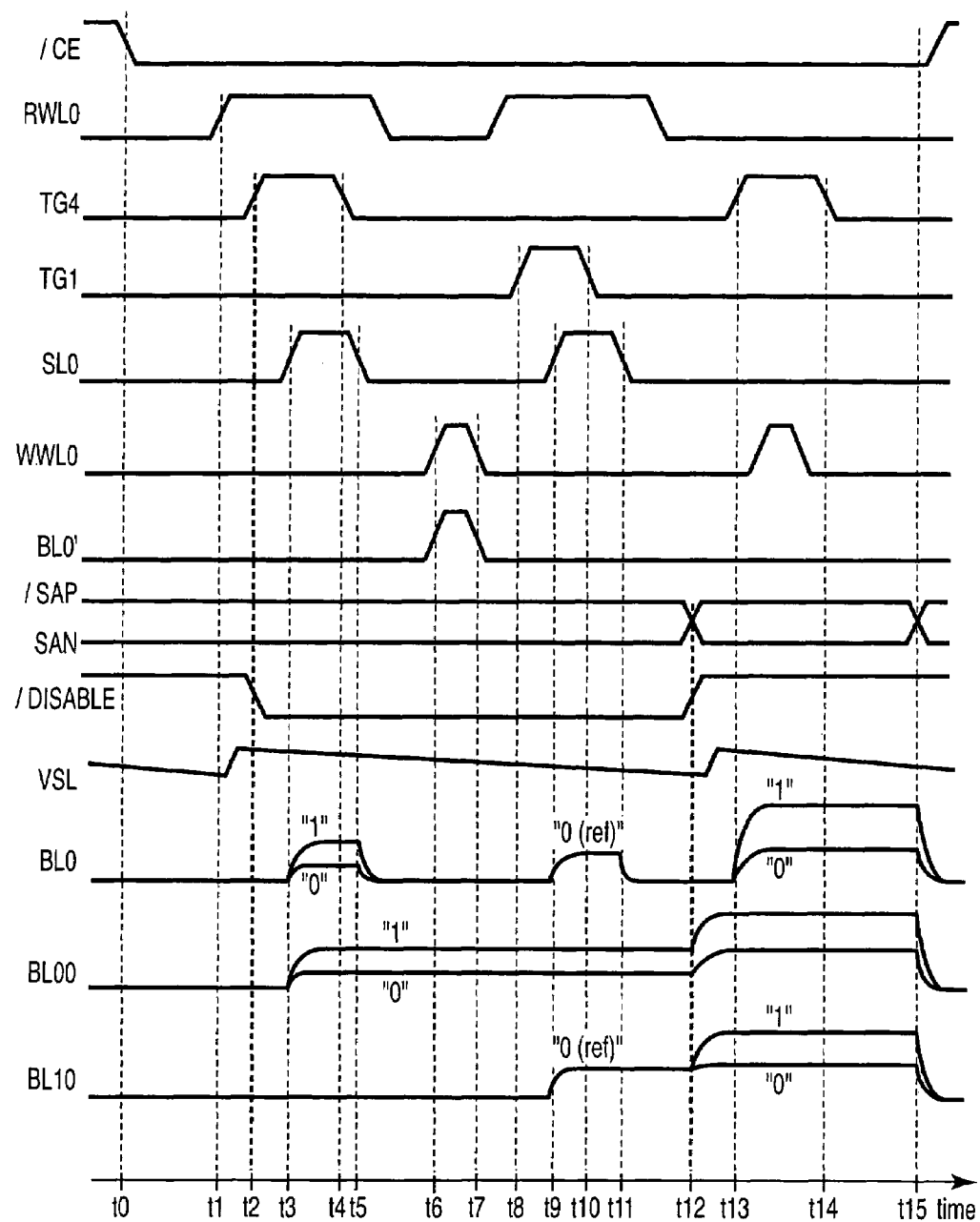
FIG. 27 is a timing chart for various signals when the MRAM according to the eleventh embodiment is in a read operation.

Next, the operation of this MRAM thus arranged will be described by way of an example of reading data out of the memory cell MC00. FIG. 27 is a timing diagram chart for various signals on the operation of reading data out of the memory cell MC00. In the description which follows, the bit line BL0 at the time of rewriting is denoted BL0' to distinguish the restoring time from other times.

[Preparation for Readout]

First, at time t0, the chip enable signal /CE is set low to make the chip active. Then, at time t1, the row decoder 20 responds to a row address signal to select the read word line RWL0 and drives it high. Next, at time t2, the signal TG4 is set high, turning the MOS transistor 31 on. Thereby, the bit line BL0 and the bit line BL00 are electrically connected together to make a preparation to lead read data from the memory cell into the sense amplifier. At the same time the signal TG4 is set high, the disable signal generator 61 sets its output signal/DISABLE low. As the result, the MOS transistor 63 in the source line voltage generator 60 is set to the normally on state. Thus, the MOS transistor 64 is turned on irrespective of the source line voltage VSL. In other words, the source line voltage VSL is freed from control of the operational amplifier 62.

[Data Readout from Memory Cell]

Next, at time t3, the source line driver drives the source line SL0 to the source line voltage. As the result, data is read out of the memory cell MC00 onto the bit line BL0. Whether the data is "1" or "0" depends on whether spins in two ferromagnetic layers of the MTJ element are parallel or not. If the spins are parallel, the resistance of the MTJ element is low; otherwise, it is high. The difference in resistance appears a potential difference on the bit line. After data has been read onto the bit line BL0, the signal TG4 and the read word line RWL0 are set low, thereby temporarily storing the data on the bit line BL00.

[Writing Reference Data into Memory Cell]

Next, at time t6, the write word line WWL0 and the bit line BL0' are set high. As the result, "0" is written into the memory cell MC00.

[Readout of Reference Data]

Next, at time t8, the signal TG1 is set high. Thus, the bit line BL0 is connected to the bit line BL10. At this point, the bit line BL0 is electrically isolated from the bit line BL00 by the MOS transistor 31. The signal TG2 remains low and hence the MOS transistor 32 is in the off state. Thus, the bit line BL1 is also electrically isolated from the bit line BL10.

At time t9, the source line driver drives the source line SL0 again. The source line voltage applied to the source line SL0 at this point is equal to that at time t3. Thereby, "0" as reference data is read onto the bit line BL0. Next, at time t10, the signal TG1 is set low. As the result, the MOS transistor 33 goes into the off state and "0" as reference data is stored on the bit line BL10.

The capacitance (CB−Cα) associated with the bit line BL10 is set smaller than the capacitance (CB) associated with the bit line BL00. Assuming that the bit line potential when "0" is stored on the bit line BL00 is V00, the bit line potential when "1" is stored on the bit line BL00 is V01, and the bit line potential when "0" as reference data is stored on the bit line BL10 is V10, therefore, the following relation holds:

V00<V10<V01

[Comparison and Amplification of Read Data]

Next, at time t15, the data read from the memory cell MC00 onto the bit line BL00 is amplified. That is, the signal /SAP is set low and the signal SAN is set high, enabling the amplification section of the sense amplifier. The data read onto the bit line BL00 is amplified with reference to the reference data read onto the bit line BL10. The high-level supply voltage of the sense amplifier is VDD and the low-level supply voltage is 0V. That is, assuming that the data read onto the bit line BL00 is "0" and V00<V10, the potential on the bit line BL00 is set to approximately 0V. If, on the other hand, the data read onto the bit line BL00 is "1" and V01>V10, then the potential on the bit line BL00 is amplified to approximately VDD.

[Rewriting]

Subsequent to the comparison and amplification in the sense amplifier 30, rewriting of data into the selected memory cell is performed.

First, at time t13, the signal TG4 is set high to electrically connect the bit lines BL00 and BL0 together with the sense amplifier 30 activated. Since "0" has already been written as the reference data, it is not necessary to drive the source line again. When "1" is to be rewritten, the bit line BL0 is set to VDD, causing "1" to be written into the selected memory cell. In writing "0", the bit line BL0 is set at 0V and the memory cell MC00 continues to store "0" already written.

As described above, the MRAM according to the eleventh embodiment of the present invention allows the reliability of read operation to be increased through the use of the plate line voltage generator described in the first embodiment as the source line voltage generator. In the MRAM, data is read by driving the source lines. If, therefore, the output voltage of the operational amplifier 61 rises or falls before and after reading of reference data as shown in FIG. 28, erroneous readout may occur as with the ferroelectric memory. With the circuit arrangement of this embodiment, however, the operational amplifier 62 in the source line voltage generator is disabled at least for the time interval from readout of data until reference data has been read. Therefore, the relation such that V00<V10<V01 is not disordered and an accurate read operation can be performed.

Even in this embodiment, the same arrangement as the plate line voltage generator is also applicable to circuits which generate the sense amplifier supply voltage and word line voltages.

A magnetic random access memory according to a twelfth embodiment of the present invention will be described next. This embodiment is a combination of the first embodiment, the second embodiment, and the eleventh embodiment. That is, the memory cell array shown in FIG. 26, the sense amplifier shown in FIG. 2 and the source line voltage generator arranged as shown in FIG. 12 or 13 are used in combination.

The twelfth embodiment can provide the same operation as the eleventh embodiment. In addition, as described in the second embodiment, the operational amplifier 61 in the source line voltage generator can be disabled for the time interval from readout of cell data until reference data has been read. The twelfth embodiment can therefore provide the same advantages as the second and eleventh embodiments.

Even in this embodiment, the same arrangement as the plate line voltage generator is also applicable to circuits which generate the sense amplifier supply voltage and word line voltages.

A ferroelectric memory according to a thirteenth embodiment of the present invention will be described next. In the first through sixth embodiments, the plate line voltage is set lower than the coercive voltage at read time in the ferroelectric memories having a cross point type of memory cell array. According to this embodiment, the plate line voltage is set higher than or equal to the coercive voltage at read time and the effect of disturbance on nonselected memory cells is reduced in a ferroelectric memory having a cross point type of memory cell array.

The ferroelectric memory of this embodiment has the block arrangement of FIG. 1 described in the first embodiment. The memory cell array 10, the row decoder 20, the plate line driver 50 and the plate line voltage generator 60 are arranged as they were described in the first embodiment.

However, the disable signal /DISABLE is not essential for the plate line voltage generator 60.

FIG. 29 shows a circuit arrangement of the sense amplifier 30 in the ferroelectric memory of this embodiment. As shown, the sense amplifier is configured such that, in the circuit arrangement of FIG. 2, the MOS transistors 33 and 34 are removed and both the MOS transistors 31 and 32 are connected at their gates to receive a signal $\phi t$.

Figure 30:
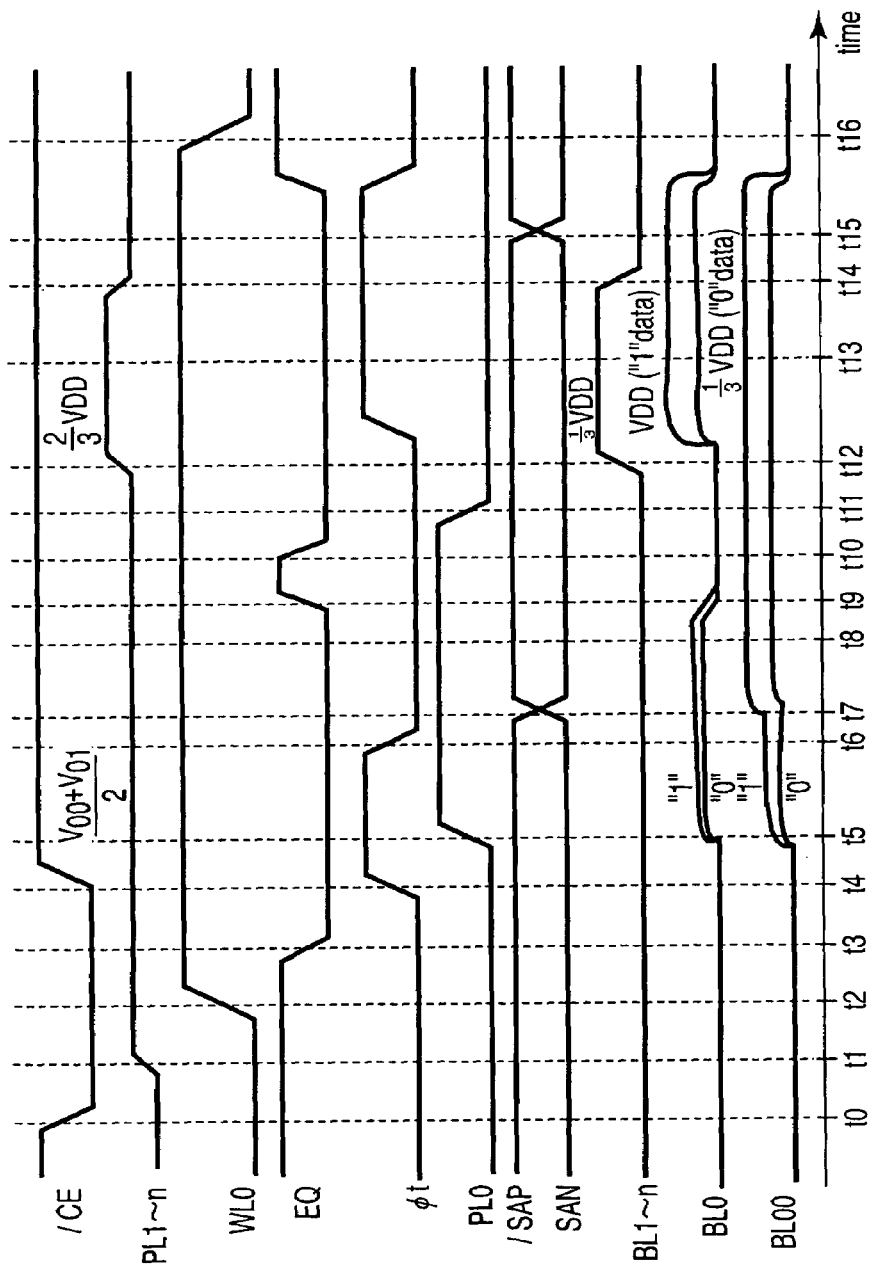
FIG. 30 is a timing chart for various signals when the ferroelectric memory according to the thirteenth embodiment is in a read operation.

Next, the operation of this ferroelectric memory thus arranged will be described by way of an example of reading data out of the memory cell MC00. FIG. 30 is a timing chart for various signals on the operation of reading data out of the memory cell MC00.

[Preparation for Readout]

First, at time t0, the chip enable signal /CE is set low to make the chip active. Next, in the state where the bit lines BL0 and BL1 are equalized the plate line driver 50 supplies the nonselected plate lines PL1 to PLn with a voltage of $$(V00+V01)/2$$

where V00 and V01 are the bit line potentials when "0" and "1" are read, respectively, with the plate line driven to VDD.

Next, at time t2, the row decoder 20 responds to a row address signal to set the word line WL0 high. Then, the equalize signal EQ is set low at time t3 and the signal $\phi t$ is set high at time t4. As the result, the MOS transistors 31 and 32 are turned on to connect the bit lines BL0 and BL1 to the bit lines BL00 and BL10, respectively. Thus, the sense amplifier is ready to read in data.

[Data Readout from Memory Cell]

Next, at time t5, the plate line driver 50 drives the plate line PL0 to the supply voltage VDD. As the result, charges are read from the memory cell MC00 onto the bit line BL0. At the same time, complementary data is read onto the bit line BL1 from the memory cell MC01.

[Comparison and Amplification of Read Data]

Next, at time t6, the signal $\phi t$ is set low to turn the MOS transistors 31 and 32 off. Subsequently, the signals /SAP and SAN are set low and high, respectively, to activate the amplifying section of the sense amplifier. Thus, the read data is amplified.

[Restoring]

Next, at time t9, the equalize signal is set high with the plate line PL0 supplied with VDD. As the result, "0" is written into the memory cell MC00.

Next, at time t11, the plate line PL0 is set low. Then, the signal $\phi t$ is set high, the nonselected bit lines BL1 to BLm are supplied with ($\frac{1}{3}$)VDD, and the nonselected plate lines PL1 to PLn are supplied with ($\frac{2}{3}$)VDD. The sense amplifier uses VDD and ($\frac{1}{3}$)VDD as its supply voltages and thus stores VDD for "1" and ($\frac{1}{3}$)VDD for "0". Therefore, for "1", VDD is applied to the selected memory cell with the signal $\phi t$ set high. That is, "1" is written into the memory cell. For "0", on the other hand, ($\frac{1}{3}$)VDD is applied to the selected memory cell. In this case, the memory cell holds "0" already written.

According to the ferroelectric memory of this embodiment, as described above, the selected plate line is supplied with the supply voltage VDD higher than or equal to the coercive voltage in reading data out of the selected memory cell. The nonselected plate lines are also supplied with (V00+V01)/2, which is lower than the coercive voltage. Therefore, the disturbance when "1" is read out of the selected memory cell can be reduced to $$V01-(V01+V00)/2=(V01-V00)/2$$

At the time of rewriting, the nonselected memory cells holding "1" are subject to disturbance, however, the magnitude of disturbance can be suppressed to at most ($\frac{1}{3}$)VDD. In a ferroelectric memory having a cross point type of memory cell array in which a plate line voltage higher than or equal to the coercive voltage is used at read time, therefore, the occurrence of erroneous reading and writing due to the disturbance can be effectively prevented.

A ferroelectric memory according to a fourteenth embodiment of the present invention will be described next. This embodiment is intended to reduce the number of supply voltages in the thirteenth embodiment.

In the thirteenth embodiment, at read time the nonselected plate lines are supplied with a voltage of $$(V00+V01)/2$$

Thereby, regardless of whether read data is "1" or "0", the absolute value of disturbance can be suppressed to $$V01-(V01+V00)/2=(V01-V00)/2$$

In this embodiment, when (V00+V01)/2 is nearly equal to ($\frac{1}{3}$)VDD or ($\frac{2}{3}$)VDD, ($\frac{1}{3}$)VDD or ($\frac{2}{3}$)VDD is applied to the nonselected plate lines in place of (V00+V01)/2.

That is, the thirteenth embodiment needs to prepare six potentials: VDD, ($\frac{2}{3}$)VDD, (V00+V01)/2, and 0V for plate lines, and VDD and ($\frac{1}{3}$)VDD for bit lines. In contrast, this embodiment eliminates the need of preparing (V00+V01)/2, allowing the power supply circuit design to be simplified.

According to the semiconductor memories of the first through twelfth embodiments of the present invention, as described above, voltages supplied for reading data out of memory cells, for example, the ferroelectric memory plate line voltage, the MRAM source line voltage, the sense amplifier supply voltage, etc., are controlled not to sharply vary at least for the time interval from readout of cell data until reference data has been read. That is, these voltages are controlled so that their rate of change with respect to time is constant. To this end, in a voltage generator adapted to generate a voltage above a constant level through comparison with a reference voltage using an operational amplifier, the operational amplifier is disabled at least for that time interval. As the result, it becomes possible to suppress a sharp change of that voltage resulting from the output voltage of the operational amplifier falling or rising before and after readout of reference data.

This point, while being very effective in cross point ferroelectric memories, is also effective in semiconductor memories having DRAM type memory cells or Series connected TC unit type ferroelectric RAM from the point of view of prevention of erroneous readout.

In addition, the reference potential can be set between the potential corresponding to "0" as cell data and the potential corresponding to "1" as cell data by controlling capacitances associated with the bit lines (see FIGS. 2 and 10) or controlling the sizes of the MOS transistors in the sense amplifier (see FIGS. 14 and 17).

Moreover, according to the ferroelectric memories of the thirteenth and fourteenth embodiment of the present invention, the effect of disturbance on nonselected memory cells can be reduced by applying a positive voltage lower than the coercive voltage to nonselected plate lines at read time, for example, a potential between the potential corresponding to "0" as cell data and the potential corresponding to "1" as cell data. Thus, a plate line voltage higher than or equal to the coercive voltage can be applied at read time while suppressing the occurrence of erroneous reading or writing due to disturbance.

In each memory cell in the MRAM described with reference to FIG. 26, the MOS transistor may be removed as shown in FIG. 31. In that case, each magneto-resistive element has its one end connected to a bit line and its other end connected to a source line.

Figure 32:
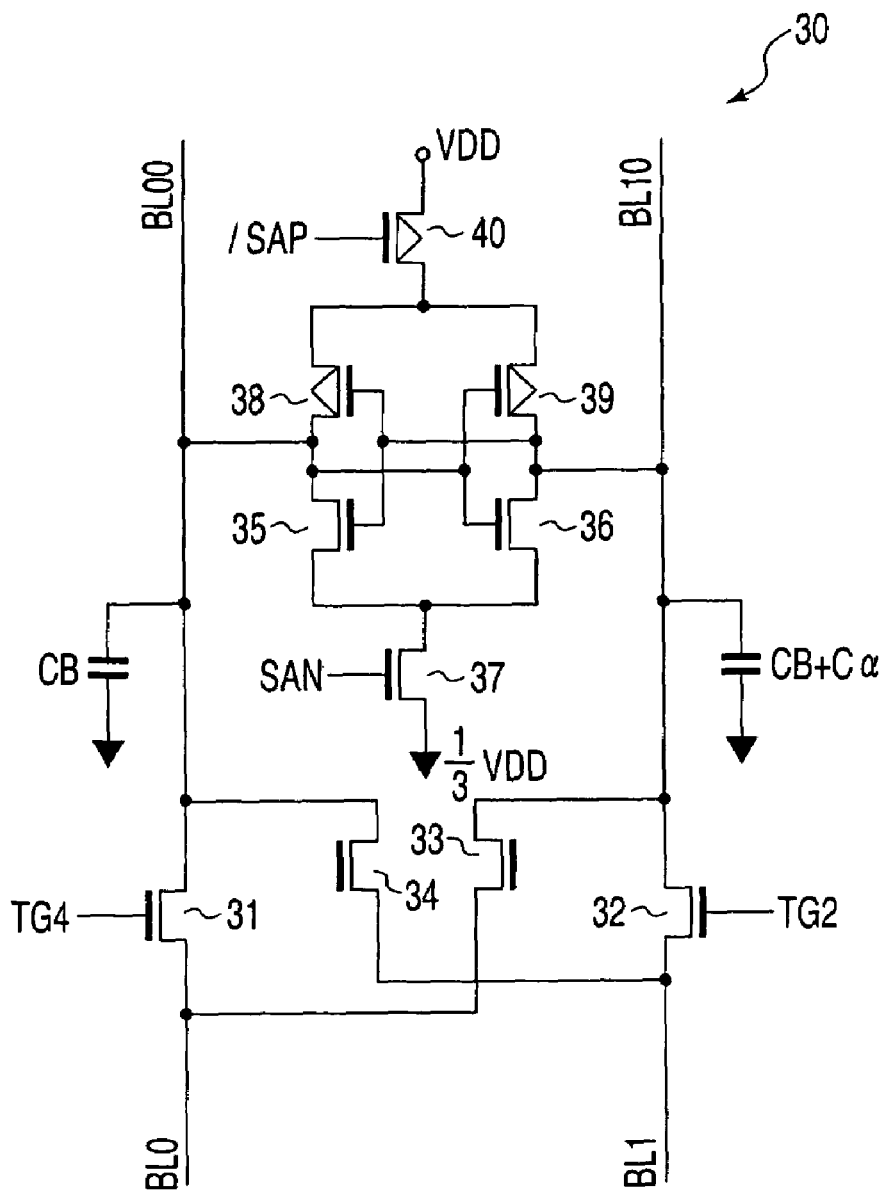
FIG. 32 is a circuit diagram of a sense amplifier according to a first modification of the first through thirteenth embodiments of the present invention.
Figure 33:
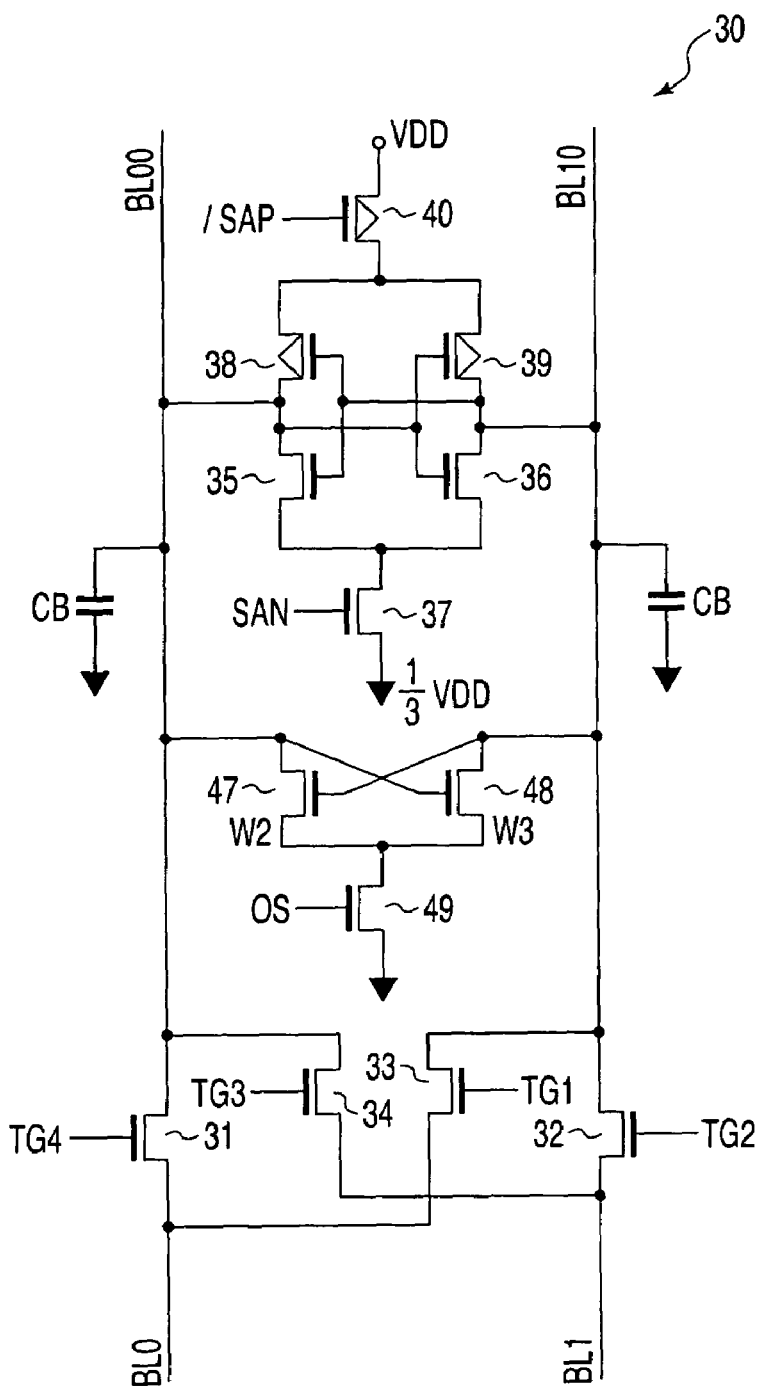
FIG. 33 is a circuit diagram of a sense amplifier according to a second modification of the first through thirteenth embodiments of the present invention.

Although the embodiments have been described as using "0" as the reference data, this is not restrictive. "1" may be used as the reference data. Assuming that the read voltage when "1" is read as the reference data is V11, the relation of V01<V11<V10 holds. In this case, the relation between the bit line capacitances shown in FIG. 2 become as shown in FIG. 32. That is, the bit line BL10 onto which the reference data is read is set larger in associated capacitance than the bit line BL00. To use the sense amplifier shown in FIG. 17, it is required to satisfy the relation of W2<W3 as shown in FIG. 33.

The embodiments have been described by way of an example of using an operational amplifier in the plate line voltage generator (source line voltage generator) and disabling the operational amplifier. However, if the rate of change with time of the plate line potential or source line potential can be kept constant, the circuit arrangement need not be restricted. The disable circuit 61 is simply arranged such that the feedback loop of the operational amplifier 62 can be disconnected and is not necessarily limited to the arrangement of FIG. 3.

In the embodiments of the present invention described above, the rate of change of a potential with respect to time is constant means that the voltage has no sharp change point for the time interval from readout of the cell data until the reference data has been read. In the embodiments, therefore, such variations that the differential coefficient of the voltage with time does not reverse from positive to negative or vice versa, or does not change from zero to positive or negative are allowable.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array having a plurality of memory cells which are arranged in columns and rows, each of the memory cells being written with "0" or "1" as reference data after "0" or "1" as cell data has been read from the memory cell;
a sense amplifier which compares and amplifies the reference data and the cell data read from the memory cell; and
a voltage generator which keeps constant rate of change with time of at least one potential supplied for a read operation for the time interval from readout of the cell data is started until the reference data has been read out.

2. The device according to claim 1, further comprising a bit line which connects commonly the memory cells arranged in the same column, and a source line which connects commonly the memory cells arranged in the same row, and wherein each of the memory cells includes a magneto-resistive element having its one end connected to the bit line and its other end connected to the source line, and the voltage generator keeps constant the rate of change with time of the potential on the source line or the potential supplied to the sense amplifier.

3. The device according to claim 1, wherein each of the memory cells includes a MOS transistor having a gate and a current path with first and second ends and a magneto-resistive element having first and second ends, the first end of the magneto-resistive element being connected to the first end of the current path of the MOS transistor, and the device further comprises a bit line which connects commonly the second ends of the magneto-resistive elements in memory cells arranged in the same column, a source line which connects commonly the second ends of the current paths of the MOS transistors in memory cells arranged in the same row, a read word line which connects commonly the gates of the MOS transistors of the memory cells arranged in the same row, and a write word line provided in proximity to the magneto-resistive elements of the memory cells arranged in the same row, and wherein the voltage generator keeps constant the rate of change with time of the potential on the source line or the potential supplied to the sense amplifier.

4. The device according to claim 1, further comprising a bit line which connects commonly the memory cells arranged in the same column, and a plate line which connects commonly the memory cells arranged in the same row, and wherein each of the memory cells includes a ferroelectric capacitor having its first end electrically connected to the bit line and its second end connected to the plate line, and the voltage generator keeps constant the rate of change with time of the potential on the plate line or the potential supplied to the sense amplifier.

5. The device according to claim 1, wherein each of the memory cells includes a MOS transistor having a gate and a current path with first and second ends and a ferroelectric capacitor having first and second ends, the first end of the ferroelectric capacitor being connected to the first end of the current path of the MOS transistor, and the device further comprises a bit line which connects commonly the second ends of the current paths of the MOS transistors in memory cells arranged in the same column, a plate line which connects commonly the second ends of the ferroelectric capacitors in memory cells arranged in the same row, and a word line which connects commonly the gates of the MOS transistors of the memory cells arranged in the same row, and wherein the voltage generator keeps constant the rate of change with time of the potential on the plate line or the potential supplied to the sense amplifier.

6. The device according to claim 1, wherein each of the memory cells includes a first MOS transistor having a gate, source, and drain and a ferroelectric capacitor connected between the source and drain of the first MOS transistor, and the memory cell array includes cell blocks each including two or more memory cells connected in series and second MOS transistors each of which selects one of the cell blocks, and the device further comprises a bit line which connects commonly one ends of the cell blocks arranged in the same column through a corresponding one of the second MOS transistors, a word line which connects commonly the gates of the MOS transistors of the memory cells arranged in the same row, a plate line which connects commonly the other ends of the cell blocks arranged in the same row, and wherein the voltage generator keeps constant the rate of change with time of the potential on the plate line or the potential supplied to the sense amplifier.

7. The device according to claim 4, wherein the voltage supplied between the first and second ends of the ferroelectric capacitor at the time of reading the cell data and the reference data is lower than a coercive voltage of the ferroelectric capacitor.

8. The device according to claim 5, wherein the voltage supplied between the first and second ends of the ferroelectric capacitor at the time of reading the cell data and the reference data is lower than a coercive voltage of the ferroelectric capacitor.

9. The device according to claim 6, wherein the voltage supplied between first and second ends of the ferroelectric capacitor at the time of reading the cell data and the reference data is lower than a coercive voltage of the ferroelectric capacitor.

10. The device according to claim 1, wherein, assuming that a read voltage when "0" as cell data is read out of the memory cell is V0, a read voltage when "1" as cell data is read out of the memory cell is V1, and a read voltage when "0" as reference data is read out of the memory cell is Vref0, the voltages V0, V1 and Vref0 are related by $$V0 < Vref0 < V1$$

11. The device according to claim 1, wherein, assuming that a read voltage when "0" as cell data is read out of the memory cell is V0, a read voltage when "1" as cell data is read out of the memory cell is V1, and a read voltage when "1" as reference data is read out of the memory cell is Vref1, the voltages V0, V1 and Vref1 are related by $$V0 < Vref1 < V1$$

12. The device according to claim 10, further comprising a first bit line onto which cell data is read out of a memory cell and a second bit line onto which "0" as reference data is read out of the memory after the cell data has been read onto the first bit line, and wherein capacitance associated with the second bit line is smaller than capacitance associated with the first bit line, and the sense amplifier compares the cell data read onto the first bit line and the reference data read onto the second bit line.

13. The device according to claim 11, further comprising a first bit line onto which cell data is read out of a memory cell and a second bit line onto which "1" as reference data is read out of the memory after the cell data has been read onto the first bit line, and wherein capacitance associated with the second bit line is larger than capacitance associated with the first bit line, and the sense amplifier compares the cell data read onto the first bit line and the reference data read onto the second bit line.

14. The device according to claim 10, further comprising a first bit line onto which cell data is read out of a memory cell, a second bit line onto which "0" as reference data is read out of the memory after the cell data has been read onto the first bit line, a first MOS transistor having its drain connected to the first bit line, its source electrically connected to ground potential and its gate connected to the second bit line, a second MOS transistor having its drain connected to the second bit line, its source electrically connected to ground potential and its gate connected to the first bit line, and wherein the first MOS transistor is higher in current drivability than the second MOS transistor, and the sense amplifier compares the cell data read onto the first bit line and the reference data read onto the second bit line.

15. The device according to Claim 11, further comprising a first bit line onto which cell data is read out of a memory cell, a second bit line onto which "1" as reference data is read out of the memory after the cell data has been read onto the first bit line, a first MOS transistor having its drain connected to the first bit line, its source electrically connected to ground potential and its gate connected to the second bit line, a second MOS transistor having its drain connected to the second bit line, its source electrically connected to ground potential and its gate connected to the first bit line, and wherein the first MOS transistor is lower in current drivability than the second MOS transistor, and the sense amplifier compares the cell data read onto the first bit line and the reference data read onto the second bit line.

16. The device according to claim 1, further comprising a bit line which connects commonly the memory cells arranged in the same column, and a plate line which connects commonly the memory cells arranged in the same row, and wherein each of the memory cells includes a ferroelectric capacitor having its one end electrically connected to the bit line and its other end connected to the plate line, and wherein the voltage generator includes a first MOS transistor having its drain electrically connected to a supply voltage and its source to supply a potential to the plate line and an operational amplifier which controls the gate voltage of the first MOS transistor such that its channel region goes into a weak inversion state, the operational amplifier being disabled for a time interval from readout of the cell data until the reference data has been read.

17. The device according to claim 16, wherein the voltage generator further includes a second MOS transistor having its gate connected to an output of the operational amplifier, its source connected to the supply voltage and its drain connected to the gate of the first MOS transistor, a first resistance element having its one end connected to the source of the second MOS transistor, and a second resistance element having its one end connected to the other end of the first resistance element and its other end connected to ground potential, and wherein the operational amplifier compares a reference potential and a potential at a connection node between the first and second resistance elements.

* * * * *